(12) United States Patent
Yin et al.

(10) Patent No.: US 11,952,450 B2
(45) Date of Patent: Apr. 9, 2024

(54) COMPOUND FOR ENCAPSULATION FILM AND COMPOSITION THEREOF, AND FILM, ORGANIC LIGHT-EMITTING DEVICE AND ENCAPSULATION METHOD

(71) Applicant: Jilin OLED Optical and Electronic Materials Co., Ltd., Changchun (CN)

(72) Inventors: Enxin Yin, Changchun (CN); Xiaochen Jiang, Changchun (CN); Weiwei Duan, Changchun (CN); Zhe Yu, Changchun (CN); Hui Wang, Changchun (CN)

(73) Assignee: Jilin OLED Optical and Electronic Materials Co., Ltd., Changchun (CN)

( * ) Notice: Subject to any disclaimer, the term of this patent is extended or adjusted under 35 U.S.C. 154(b) by 0 days.

(21) Appl. No.: 17/628,916

(22) PCT Filed: Mar. 26, 2020

(86) PCT No.: PCT/CN2020/081276
§ 371 (c)(1),
(2) Date: Jan. 21, 2022

(87) PCT Pub. No.: WO2021/012700
PCT Pub. Date: Jan. 28, 2021

(65) Prior Publication Data
US 2022/0259352 A1    Aug. 18, 2022

(30) Foreign Application Priority Data
Jul. 23, 2019    (CN) .......................... 201910664282.8

(51) Int. Cl.
*C08F 222/10*    (2006.01)
*C07F 7/08*    (2006.01)
(Continued)

(52) U.S. Cl.
CPC .......... *C08F 222/102* (2020.02); *C07F 7/081* (2013.01); *C09D 4/00* (2013.01);
(Continued)

(58) Field of Classification Search
CPC ...... C08F 222/102; C08F 2/48; C08F 220/28; C08F 283/06; H10K 85/151; H10K 85/40;
(Continued)

(56) References Cited

FOREIGN PATENT DOCUMENTS

| CN | 1997334 A | 7/2007 |
|---|---|---|
| JP | 2019011390 A | 1/2019 |

(Continued)

*Primary Examiner* — Shane Fang
(74) *Attorney, Agent, or Firm* — Laine IP Oy

(57) ABSTRACT

A compound for an encapsulation film and a composition thereof, a film, an organic light-emitting device, and an encapsulation method are provided. The composition comprises the compound, one or more photocurable and thermocurable propenyl compounds, and one or more compounds that produce a free radical and produce an acid under light or heat. The encapsulation film includes the composition as a film of an organic layer. The organic light-emitting device includes the film. The encapsulation method involves encapsulating the organic light-emitting device using the encapsulation film. The composition containing the compound serves as an organic layer. An encapsulation film for the organic light-emitting device is manufactured by repetitively and alternately laminating an inorganic layer and the organic layer.

13 Claims, 1 Drawing Sheet

(51) Int. Cl.
  *C09D 4/00* (2006.01)
  *H10K 50/844* (2023.01)
  *H10K 85/10* (2023.01)
  *H10K 85/40* (2023.01)

(52) U.S. Cl.
  CPC ........... *H10K 85/151* (2023.02); *H10K 85/40* (2023.02); *H10K 50/8445* (2023.02)

(58) Field of Classification Search
  CPC ....... H10K 50/8445; C07F 7/081; C09D 4/00; B29C 64/40; B29C 64/112; B29C 64/35; B29C 35/08; B33Y 10/00; B33Y 40/00; B33Y 70/00; B33Y 80/00; C11D 7/06; C11D 7/14; G03G 9/08722; G03G 9/08728; G03G 9/08793; G03G 9/08795; B29K 2033/04; G03F 7/0037; G03F 7/027
  See application file for complete search history.

(56) References Cited

FOREIGN PATENT DOCUMENTS

| | | | | |
|---|---|---|---|---|
| KR | 20150146106 A | 12/2015 | | |
| WO | WO 2019003563 | * | 1/2019 | ............. B32B 21/08 |

\* cited by examiner

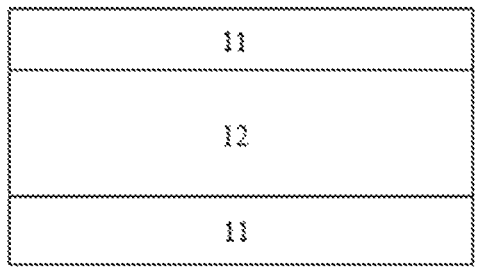

COMPOUND FOR ENCAPSULATION FILM AND COMPOSITION THEREOF, AND FILM, ORGANIC LIGHT-EMITTING DEVICE AND ENCAPSULATION METHOD

TECHNICAL FIELD

The present disclosure relates to the technical field of thin film encapsulation structures, in particular to a compound for an encapsulation thin film, a composition thereof, a thin film, an organic light-emitting device, and an encapsulation method. The present disclosure relates to a thin film formed by repeated coating of inorganic layer(s) and organic layer (s), which exhibits low transmission rate of oxygen and moisture, and the encapsulation film prolongs the life of the organic light-emitting device, and enhances the etching resistance of the organic layer to plasma to achieve an encapsulation composition for an organic/inorganic hybrid encapsulation film having higher flatness, an encapsulation thin film, and a display device using the same.

BACKGROUND ART

An organic light-emitting display device includes an organic light-emitting device (OLED) composed of a hole injection electrode (anode), an organic light-emitting layer, and an electron injection electrode (cathode). This organic light-emitting device is generally provided on a glass substrate, and is covered with another substrate in order to prevent deterioration due to inflow of moisture or oxygen from the outside. Recently, display devices including organic light-emitting display devices are gradually getting thinner due to the demand of consumers. In order to meet this demand, in an organic light-emitting device, thin film encapsulation (TFE) is also applied to covering of the organic light-emitting device.

A thin film encapsulation structure is a structure in which one or more layers of inorganic films and organic films are alternately stacked above a formed organic light-emitting device within the display range of a substrate to cover the display range so as to protect the organic light-emitting device. The inorganic films and organic films stacked are generally called a thin film encapsulation layer. The organic light-emitting display device with this thin film encapsulation layer optimizes, together with the flexible substrate, the flexibility of the device. In addition, this organic light-emitting display device enables design diversity, and most importantly, enables thinning of the device.

The inorganic film used in the existing thin film encapsulation structure is formed by vapor deposition through sputtering, chemical vapor deposition (CVD), or other method for generating plasma. When an underlying organic film has a structure that is weak to plasma, the surface of the underlying organic film is etched, resulting in the reduction of the flatness of the inorganic film thereon and also the reduction of water vapor transmission rate (WVTR).

SUMMARY

The present disclosure aims to solve the technical problems in the prior art, and provides a compound for an encapsulation thin film, a composition thereof, a thin film, an organic light-emitting device, and an encapsulation method. In the present disclosure, when an encapsulation film for an organic light-emitting device is produced by repeatedly stacking inorganic films and organic films in an alternate manner, a plasma-resistant structure is introduced into a lower organic layer, thereby preventing the surface thereof from being etched when the inorganic film is vapor deposited, and consequently maintaining a high flatness. Relatively speaking, this has a huge impact on the flatness of the upper inorganic film with a smaller thickness. The encapsulation thin film containing the compound or composition provided by the present disclosure has a high water vapor transmission rate, and the encapsulation thin film can be used to make an organic light-emitting device with bendability.

In order to solve the above-mentioned technical problems, the technical solution of the present disclosure is as follows.

The present disclosure provides a compound for an encapsulation thin film, having a structure shown in chemical structural formula 1:

<Chemical structural formula 1>

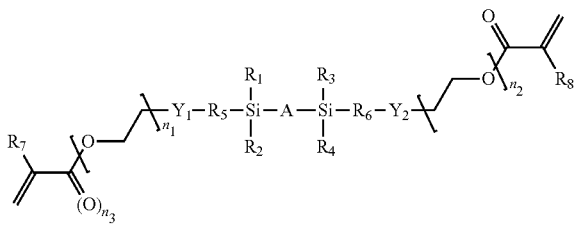

where

A is an alkylamino group having 6 to 12 carbons or an alkoxy-substituted or unsubstituted aromatic group;

$R_1$ to $R_4$ are the same or different alkyl groups having 1 to 6 carbons or aromatic groups;

$R_5$ and $R_6$ are the same or different alkyl groups having 2 to 6 carbons or groups including 1 to 6 alkyl groups and a vinyloxy group;

$R_7$ and $R_8$ are hydrogen or methyl;

$n_1$ and $n_2$ are the same natural numbers;

$n_3$ is 0 or 1; and $Y_1$ and $Y_2$ are the same or different, and are oxygen, alkyl substituted or unsubstituted amino or sulfur, or any one selected from the following chemical structural formulae 2 to 4;

<Chemical structural formula 2>

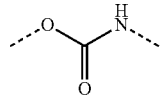

<Chemical structural formula 3>

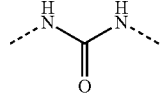

<Chemical structural formula 4>

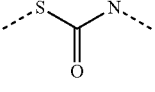

The present disclosure also provides a composition comprising: component A, component B, and component C;

component A: the compound for an encapsulation thin film represented by chemical structural formula 1;

component B: one or more photocurable and thermocurable acryl-based compounds; and component C: one or more compounds that generate free radicals and acids upon exposure to light or heat.

In the above-mentioned technical solution, the weight percentage of each component is as follows:

the weight percentage of the component A is: 9.5-90%;
the weight percentage of the component B is: 9.5-90%; and
the weight percentage of the component C is: 0.5-10%.

In the above technical solution, the component B is one or more of 2-phenoxyethyl acrylic acid, 2-phenoxyethyl (meth) acrylic acid, 3-phenoxypropyl acrylic acid, 3-phenoxypropyl (meth)acrylic acid, 4-phenoxybutyl acrylic acid, 4-phenoxybutyl (meth)acrylic acid, 5-phenoxypentyl acrylic acid, 5-phenoxypentyl (meth)acrylic acid, 6-phenoxyhexyl acrylic acid, 6-phenoxyhexyl (meth)acrylic acid, 7-phenoxyheptyl acrylic acid, 7-phenoxyheptyl (meth)acrylic acid, 8-phenoxyoctyl acrylic acid, 8-phenoxyoctyl (meth) acrylic acid, 9-phenoxynonyl acrylic acid, 9-phenoxynonyl (meth)acrylic acid, 10-phenoxydecyl acrylic acid, 10-phenoxydecyl(meth)acrylic acid, 2-(thiophenyl)ethyl acrylic acid, 2-(thiophenyl)ethyl(meth)acrylic acid, 3-(thiophenyl) propyl acrylic acid, 3-(thiophenyl)propyl (meth)acrylic acid, 4-(thiophenyl)butyl acrylic acid, 4-(thiophenyl)butyl (meth) acrylic acid, 5-(thiophenyl)pentyl acrylic acid, 5-(thiophenyl)pentyl (meth)acrylic acid, 6-(thiophenyl)hexyl acrylic acid, 6-(thiophenyl)hexyl (meth)acrylic acid, 7-(thiophenyl) heptyl acrylic acid, 7-(thiophenyl)heptyl (meth)acrylic acid, 8-(thiophenyl)octyl acrylic acid, 8-(thiophenyl)octyl (meth) acrylic acid, 9-(thiophenyl)nonyl acrylic acid, 9-(thiophenyl)nonyl (meth)acrylic acid, 10-(thiophenyl)decyl acrylic acid, 10-(thiophenyl)decyl (meth)acrylic acid, 2-(naphthalen-2-yloxy)ethyl acrylic acid, 2-(naphthalen-2-yloxy)ethyl (meth)acrylic acid, 3-(naphthalen-2-yloxy)propyl acrylic acid, 3-(naphthalen-2-yloxy)propyl (meth)acrylic acid, 4-(naphthalen-2-yloxy)butyl acrylic acid, 4-(naphthalen-2-yloxy)butyl (meth)acrylic acid, 5-(naphthalen-2-yloxy)pentyl acrylic acid, 5-(naphthalen-2-yloxy)pentyl (meth)acrylic acid, 6-(naphthalen-2-yloxy)hexyl acrylic acid, 6-(naphthalen-2-yloxy)hexyl (meth)acrylic acid, 7-(naphthalen-2-yloxy)heptyl acrylic acid, 7-(naphthalen-2-yloxy)heptyl (meth)acrylic acid, 8-(naphthalen-2-yloxy)octyl acrylic acid, 8-(naphthalen-2-yloxy)octyl (meth)acrylate, 9-(naphthalen-2-yloxy)nonyl acrylate, 9-(naphthalen-2-yloxy)nonyl (meth)acrylate, 10-(naphthalene-2-yloxyyloxy)decyl acrylate (10-(naphthalene-2-yloxy)decyl acrylate), 10-(naphthalen-2-yloxy)decyl (meth)acrylate, 2-(naphthalene-2-)ethyl acrylate (2-(naphthalene-2-ylthio)ethyl acrylate), 2-(naphthalen-2-ylthio)ethyl (meth)acrylate, 3-(naphthalen-2-ylthio)propyl acrylate, 3-(naphthalen-2-ylthio)propyl (meth) acrylate, 4-(naphthalen-2-ylthio)butylnaphthalene acrylate, 4-(naphthalen-2-ylthio)butyl (meth)acrylate, 5-(naphthalen-2-ylthio)pentyl acrylate, 5-(naphthalen-2-ylthio)ylnaphthalene (meth)acrylate, 6-(naphthalen-2-ylthio)hexylacrylate, 6-(naphthalen-2-ylthio)hexyl (meth)acrylate, 7-(naphthalen-2-ylthio)heptyl acrylate, 7-(naphthalen-2-ylthio)heptyl (meth)acrylate, 8-(naphthalen-2-ylthio)octyl acrylate, 8-(naphthalen-2-ylthio)octyl (meth)acrylate, 9-(naphthalen-2-ylthio)nonyl acrylate, 9-(naphthalen-2-ylthio)nonyl (meth)acrylate, 10-(naphthalen-2-ylthio)decyl acrylate, 10-(naphthalen-2-ylthio)decyl (meth)acrylate, 2-([1,1'-biphenyl]-4-yloxy)ethyl acrylate, 2-([1,1'-biphenyl]-4-yloxy) ethyl (meth)acrylate, 3-([1,1'-biphenyl]-4-yloxy)propyl acrylate, 3-([1,1'-biphenyl]-4-yloxy)propyl (meth)acrylate, 4-([1,1'-biphenyl]-4-yloxy)butyl acrylate, 4-([1,1'-biphenyl]-4-yloxy)butyl (meth)acrylate, 5-([1,1'-biphenyl]-4-yloxy)ylnaphthalene acrylate, 5-([1,1'-biphenyl]-4-yloxy) ylnaphthalene (meth)acrylate, 6-([1,1'-biphenyl]-4-yloxy) hexyl acrylate, 6-([1,1'-biphenyl]-4-yloxy)hexyl (meth) acrylate, 7-([1,1'-biphenyl]-4-yloxy)heptyl acrylate, 7-([1,1'-biphenyl]-4-yloxy)heptyl (meth)acrylate, 8-([1,1'-biphenyl]-4-yloxy)octyl acrylate, 8-([1,1'-biphenyl]-4-yloxy)octyl (meth)acrylate, 9-([1,1'-biphenyl]-4-yloxy) nonyl acrylate, 9-([1,1'-biphenyl]-4-yloxy)nonyl (meth) acrylate, 10-([1,1'-biphenyl]-4-yloxy)decyl acrylate, 10-([1,1'-biphenyl]-4-yloxy)decyl (meth)acrylate, 2-([1,1'-biphenyl]-4-ylthio)ethyl acrylate, 2-([1,1'-biphenyl]-4-ylthio)ethyl (meth)acrylate, 3-([1,1'-biphenyl]-4-ylthio) propyl acrylate, 3-([1,1'-biphenyl]-4-ylthio)propyl (meth) acrylate, 4-([1,1'-biphenyl]-4-ylthio)butyl acrylate, 4-([1,1'-biphenyl]-4-ylthio)butyl (meth)acrylate, 5-([1,1'-biphenyl]-4-ylthio)ylnaphthalene acrylate, 5-([1,1'-biphenyl]-4-ylthio) ylnaphthalene (meth)acrylate, 6-([1,1'-biphenyl]-4-ylthio) hexyl acrylate, 6-([1,1'-biphenyl]-4-ylthio)hexyl (meth) acrylate, 7-([1,1'-biphenyl]-4-ylthio)heptyl acrylate, 7-([1,1'-biphenyl]-4-ylthio)heptyl (meth)acrylate, 8-([1,1'-biphenyl]-4-ylthio)octyl acrylate, 8-([1,1'-biphenyl]-4-ylthio)octyl (meth)acrylate, 9-([1,1'-biphenyl]-4-ylthio) nonyl acrylate, 9-([1,1'-biphenyl]-4-ylthio)nonyl (meth) acrylate, 10-([1,1'-biphenyl]-4-ylthio)decyl acrylate, 10-([1,1'-biphenyl]-4-ylthio)decyl (meth)acrylate, 2-hydroxy-2-phenoxyethyl acrylate, 2-hydroxy-2-phenoxyethyl (meth) acrylate, 2-hydroxy-2-(naphthalen-2-yloxy)ethyl acrylate, 2-hydroxy-2-(naphthalen-2-yloxy)ethyl (meth)acrylate, 2-([1,1'-biphenyl]-4-yloxy)ethyl acrylate, 2-([1,1'-biphenyl]-4-yloxy)ethyl (meth)acrylate, 2-(2-phenoxyethoxy) ethyl acrylate, 2-(2-phenoxyethoxy)ethyl (meth)acrylate, 2-(phenoxymethoxy)ethyl acrylate, 2-(phenoxymethoxy) ethyl (meth)acrylate, 2-(([1,1'-biphenyl]-4-yloxy)methoxy) ethyl acrylate, 2-(([1,1'-biphenyl]-4-yloxy)methoxy)ethyl (meth)acrylate, 2-((naphthalen-2-yloxy)methoxy)ethyl acrylate, 2-((naphthalen-2-yloxy)methoxy)ethyl (meth) acrylate, 2-((thiophenyl)methoxy)ethyl acrylate, 2-((thiophenyl)methoxy)ethyl (meth)acrylate, 2-((naphthalen-2-ylthio)methoxy)ethyl acrylate, 2-((naphthalen-2-ylthio) methoxy)ethyl (meth)acrylate, 2,2'-(4,4'-(9H-fluorene-9,9-diyl)bis(4,1-phenylene))bis(oxy)bis(ethane-2,1-diyl) diacrylate, 2,2'-(4,4'-(9H-fluorene-9,9-diyl)bis(4,1-phenylene))bis(oxy)bis(ethane-2,1-diyl) bis(2-methyl acrylate), 3,3'-(4,4'-(9H-fluorene-9,9-diyl)bis(4,1-phenylene))bis (oxy)bis(propane-3,1-diyl)diacrylate, 3,3'-(4,4'-(9H-fluorene-9,9-diyl)bis(4,1-phenylene))bis(oxy)bis(propane-3,1-diyl)bis(2-methyl acrylate), 2,2'-(4,4'-(9H-fluorene-9,9-diyl)bis(4,1-phenylene))bis(thiodiyl)bis(ethane-2,1-diyl) diacrylate, 2,2'-(4,4'-(9H-fluorene-9,9-diyl)bis(4,1-phenylene))bis(thiodiyl)bis(ethane-2,1-diyl)bis(2-methyl acrylate), 3,3'-(4,4'-(9H-fluorene-9,9-diyl)bis(4,1-phenylene)) bis(thiodiyl)bis(propane-3,1-diyl)diacrylate, 3,3'-(4,4'-(9H-fluorene-9,9-diyl)bis(4,1-phenylene))bis(thiodiyl)bis (propane-3,1-diyl)bis(2-methyl acrylate), 2,2'-(4,4'-(4,4'-(9H-fluorene-9,9-diyl)bis(4,1-phenylene))bis(oxy)bis(4,1-phenylene))bis(oxy)bis(ethane-2,1-diyl)diacrylate, 2,2'-(4, 4'-(4,4'-(9H-fluorene-9,9-diyl)bis(4,1-phenylene))bis(oxy) bis(4,1-phenylene))bis(oxy)bis(ethane-2,1-diyl)bis(2-methyl acrylate), 3,3'-(4,4'-(4,4'-(9H-fluorene-9,9-diyl)bis (4,1-phenylene))bis(oxy)bis(4,1-phenylene))bis(oxy)bis (propane-3,1-diyl)diacrylate, 3,3'-(4,4'-(4,4'-(9H-fluorene-9,9-diyl)bis(4,1-phenylene))bis(oxy)bis(4,1-phenylene))bis (oxy)bis(propane-3,1-diyl)bis(2-methyl acrylate), 2,2'-(4,4'-(4,4'-(9H-fluorene-9,9-diyl)bis(4,1-phenylene))bis(thiodiyl) bis(4,1-phenylene))bis(oxy)bis(ethane-2,1-diyl) diacrylate, 2,2'-(4,4'-(4,4'-(9H-fluorene-9,9-diyl)bis(4,1-phenylene))bis (thiodiyl)bis(4,1-phenylene))bis(oxy)bis(ethane-2,1-diyl) bis(2-methyl acrylate), 3,3'-(4,4'-(4,4'-(9H-fluorene-9,9-diyl)bis(4,1-phenylene))bis(thiodiyl)bis(4,1-phenylene))bis (oxy)bis(propane-3,1-diyl) diacrylate, 3,3'-(4,4'-(4,4'-(9H-fluorene-9,9-diyl)bis(4,1-phenylene))bis(thiodiyl)bis(4,1-phenylene))bis(oxy)bis(propane-3,1-diyl)bis(2-methyl acrylate), 2,2'-(2,2'-(4,4'-(9H-fluorene-9,9-diyl)bis(4,1-phenylene))bis(oxy)bis(ethane-2,1-diyl))bis(oxy)bis(ethane-2,-1diyl) diacrylate (2,2'-(2,2'-(4,4'-(9H-fluorene-9,9-diyl)bis(4,1-phenylene))bis(oxy)bis(ethane-2,1-diyl))bis(oxy)bis(ethane-2,1-diyl) diacrylate), 2,2'-(2,2'-(4,4'-(9H-fluorene-9,9-diyl)bis(4,1-phenylene))bis(oxy)bis(ethane-2,1-diyl))bis(oxy)bis(ethane-2,-1diyl)bis(2-methyl acrylate) (2,2'-(2,2'-(4,4'-(9H-fluorene-9,9-diyl)bis(4,1-phenylene))bis(oxy)bis(ethane-2,1-diyl))bis(oxy)bis(ethane-2,1-diyl)bis(2-methyl acrylate)), 2,2'-(2,2'-(4,4'-(9H-fluorene-9,9-diyl)bis(4,1-phenylene))bis(thiodiyl)bis(ethane-2,1-diyl))bis(oxy)bis(ethane-2,-1diyl) diacrylate (2,2'-(2,2'-(4,4'-(9H-fluorene-9,9-diyl)bis(4,1-phenylene))bis(thiodiyl)bis(ethane-2,1-diyl))bis(oxy)bis(ethane-2,1-diyl) diacrylate), 2,2'-(2,2'-(4,4'-(9H-fluorene-9,9-diyl)bis(4,1-phenylene))bis(thiodiyl)bis(ethane-2,1-diyl))bis(oxy)bis(ethane-2,-1diyl)bis(2-methyl acrylate)(2,2'-(2,2'-(4,4'-(9H-fluorene-9,9-diyl)bis(4,1-phenylene))bis(thiodiyl) bis(ethane-2,1-diyl))bis(oxy)bis(ethane-2,1-diyl)bis(2-methyl acrylate)), 2,2'-(4,4'-oxybis(4,1-phenylene)bis(oxy))bis(ethane-2,1-diyl) diacrylate, 2,2'-(4,4'-oxybis(4,1-phenylene)bis(oxy))bis(ethane-2,1-diyl)bis(2-methyl acrylate), 2,2'-(4,4'-oxybis(4,1-phenylene)bis(thiodiyl))bis(ethane-2,1-diyl) diacrylate, 2,2'-(4,4'-oxybis(4,1-phenylene)bis(thiodiyl))bis(ethane-2,1-diyl)bis(2-methyl acrylate), 2,2'-(4,4'-thiobis(4,1-phenylene)bis(oxy))bis(ethane-2,1-diyl) diacrylate, 2,2'-(4,4'-thiobis(4,1-phenylene)bis(oxy))bis(ethane-2,1-diyl)bis(2-methyl acrylate), 2,2'-(4,4'-thiobis(4,1-phenylene)bis(thiodiyl))bis(ethane-2,1-diyl) diacrylate, 2,2'-(4,4'-thiobis(4,1-phenylene)bis(thiodiyl))bis(ethane-2,1-diyl)bis(2-methyl acrylate), 2,2'-(3,3'-(4,4'-oxybis(4,1-phenylene)bis(oxy))bis(propane-3,1-diyl))bis(oxy)bis (ethane-2,1-diyl) diacrylate, 2,2'-(3,3'-(4,4'-oxybis(4,1-phenylene)bis(oxy))bis(propane-3,1-diyl))bis(oxy)bis (ethane-2,1-diyl)bis(2-methyl acrylate), 2,2'-(3,3'-(4,4'-thiobis(4,1-phenylene)bis(oxy))bis(propane-3,1-diyl))bis(oxy)bis (ethane-2,1-diyl) diacrylate, 2,2'-(3,3'-(4,4'-thiobis(4,1-phenylene)di(oxy))bis(propane-3,1-diyl))bis(oxy)bis(ethane-2,1-diyl)bis(2-methyl acrylate), 2,2'-(3,3'-(4,4'-oxybis(4,1-phenylene)bis(thiodiyl))bis(propane-3,1-diyl))bis(oxy)bis(ethane-2,1-diyl) diacrylate, 2,2'-(3,3'-(4,4'-oxybis(4,1-phenylene)bis(thiodiyl))bis(propane-3,1-diyl))bis(oxy)bis(ethane-2,1-diyl)bis(2-methyl acrylate), 2,2'-(3,3'-(4,4'-thiobis(4,1-phenylene)bis(thiodiyl))bis(propane-3,1-diyl))bis(oxy)bis(ethane-2,1-diyl) diacrylate, 2,2'-(4,4'-(propane-2,2-diyl)bis(4,1-phenylene))bis(oxy)bis(ethane-2,1-diyl) diacrylate, 2,2'-(4,4'-(propane-2,2-diyl)bis(4,1-phenylene))bis(oxy)bis(ethane-2,1-diyl) bis (2-methyl acrylate), 2,2'-(4,4'-(propane-2,2-diyl)bis(4,1-phenylene))bis(thiodiyl)bis(ethane-2,1-diyl) diacrylate, 2,2'-(4,4'-(propane-2,2-diyl)bis(4,1-phenylene))bis(thiodiyl)bis(ethane-2,1-diyl) bis(2-methyl acrylate), 2,2'-(2,2'-(4,4'-(propane-2,2-diyl)bis(4,1-phenylene))bis(oxy)bis(ethane-2,1-diyl))bis(oxy)bis(ethane-2,1-diyl) diacrylate, 2,2'-(2,2'-(4,4'-(propane-2,2-diyl)bis(4,1-phenylene))bis(oxy)bis(ethane-2,1-diyl))bis(oxy)bis(ethane-2,1-diyl)bis(2-methyl acrylate), 2,2'-(2,2'-(4,4'-(propane-2,2-diyl)bis(4,1-phenylene))bis(thiodiyl)bis(ethane-2,1-diyl))bis(oxy)bis(ethane-2,1-diyl) diacrylate, 2,2'-(2,2'-(2,2'-(4,4'-(propane-2,2-diyl)bis(4,1-phenylene))bis(oxy)bis(ethane-2,1-diyl))bis(oxy)bis(ethane-2,1-diyl)) bis(oxy)bis(ethane-2,1-diyl))bis(oxy)bis(ethane-2,1-diyl)bis(2-methyl acrylate), 2,2'-(2,2'-(2,2'-(4,4'-(propane-2,2-diyl)bis(4,1-phenylene))bis(thiodiyl)bis(ethane-2,1-diyl))bis(oxy)bis(ethane-2,1-diyl))bis(oxy)bis(ethane-2,1-diyl) diacrylate, 2,2'-(2,2'-(2,2'-(4,4'-(propane-2,2-diyl)bis(4,1-phenylene))bis(thiodiyl)bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-oxybis(4,1-phenylene)bis(oxy))bis(ethane-2,1-diyl))bis(oxy)bis(ethane-2,1-diyl)bis (oxy)bis(ethane-2,1-diyl) diacrylate, 2,2'-(2,2'-(2,2'-(4,4'-oxybis(4,1-phenylene)bis(oxy))bis(ethane-2,1-diyl))bis(oxy)bis(ethane-2,1-diyl)bis(oxy)bis(ethane-2,1-diyl)bis(2-methyl acrylate), 2,2'-(2,2'-(2,2'-(4,4'-thiobis(4,1-phenylene)bis(oxy))bis(ethane-2,1-diyl))bis(oxy)bis (ethane-2,1-diyl)bis(oxy)bis(ethane-2,1-diyl) diacrylate, 2,2'-(2,2'-(2,2'-(4,4'-thiobis(4,1-phenylene)bis(oxy))bis(ethane-2,1-diyl))bis(oxy)bis(ethane-2,1-diyl)bis(oxy)bis(ethane-2,1-diyl)bis(2-methyl acrylate), 2,2'-(2,2'-(2,2'-(4,4'-thiobis(4,1-phenylene)bis(thiodiyl))bis(ethane-2,1-diyl)bis(oxy)bis(ethane-2,1-diyl))bis(oxy)bis(ethane-2,1-diyl) diacrylate, 2,2'-(2,2'-(2,2'-(4,4'-thiobis(4,1-phenylene)bis(thiodiyl))bis(ethane-2,1-diyl)bis(oxy)bis(ethane-2,1-diyl))bis(oxy)bis(ethane-2,1-diyl)bis(2-methyl acrylate), polyester ethyl carbamate diacrylate, tripropylene glycol diacrylate, ethyl carbamate acrylate, epoxy resin acrylate, thiophenylethyl (meth)acrylate, isobornyl acrylate, phenoxyethyl(meth)acrylic acid, phenoxy-2-methyl-ethyl (meth)acrylic acid, phenoxyethoxyethyl (meth)acrylic acid, phenoxyphenyl acrylic acid, 3-phenoxy-2-hydroxylpropyl (meth)acrylate, 2-1-naphthoxyethyl (meth)acrylic acid, 2-2-naphthoxyethyl (meth)acrylic acid, 2-1-naphthylthioethyl (meth)acrylic acid, 2-2-naphthothioethyl (meth)acrylic acid, trimethylolpropyl triacrylate, 1,12-dodecanediol dimethacrylate, 1,6-hexanediol diacrylate, and 1,10-decanediol diacrylate.

In the above-mentioned technical solution, the component C is a photopolymerization initiator and/or a free radical polymerization initiator; the photopolymerization initiator is one or more of an acetophenone compound, a benzophenone compound, a thioxanthone compound, a benzoin compound, a triazine compound, a carbazole compound, a diketone compound, a sulfonium borate compound, a diazonium salt compound, an imidazole compound, and a non-imidazole compound; and the free radical polymerization initiator is one or more of a peroxide compound and a bisazo compound.

The present disclosure also provides an encapsulation thin film, which is a thin film layer using the composition provided by the present disclosure and being formed by stacking under the following conditions;

It is a thin film layer formed by performing coating by laminating same or independent organic layers and inorganic layers once or more times;

the organic layer is the composition provided by the present disclosure; and the inorganic layer is formed of one or more of silicon nitride, silicon oxynitride, silicon oxide, aluminum oxide, zirconium oxide, titanium oxide, and zinc oxide, where the inorganic layers stacked may be different.

In the above-mentioned technical solution, the encapsulation thin film is a thin film layer with a water vapor transmission rate of $9*10^{-2}$ g/m$^2$·day or less.

In the above-mentioned technical solution, the inorganic layer of the encapsulation thin film is arranged on one or two surfaces of the organic layer.

The present disclosure also provides an organic light-emitting device encapsulated with the encapsulation thin film of the present disclosure.

The present disclosure also provides an encapsulation method for an organic light-emitting device, comprising steps of:

directly applying the encapsulation thin film of the present disclosure onto the organic light-emitting device, or alternatively, directly making the encapsulation thin film into a thin film form and attaching it onto the organic light-emitting device.

The present disclosure provides the following beneficial effects.

The present disclosure provides a compound for an encapsulation thin film and a composition thereof. The composition is used as an organic layer, and an encapsulation thin film for an organic light-emitting device is manufactured by repeatedly stacking inorganic layer(s) and the organic layer (s) in an alternate manner, so that the organic layer in the organic light-emitting device can be isolated from oxygen and moisture to protect the organic light-emitting device. Moreover, the thin film formed by repeatedly stacking the inorganic layers and organic layers in an alternate manner exhibits low water vapor transmission rate (WVTR) and bendability. In addition, the structure resistant to plasma is applied to the organic layer, which effectively prevents the organic film from being damaged by the plasma generated during the vapor deposition of the inorganic film. This allows maintaining a high flatness on the organic film onto which the inorganic film is vapor deposited, thus achieving more stable deposition of the inorganic film. This includes providing an encapsulation film that exhibits a high water vapor transmission rate and a flexible organic light-emitting device manufactured with the encapsulation film.

BRIEF DESCRIPTION OF DRAWINGS

The present disclosure will be further described in detail below with reference to the accompanying drawings and specific embodiments.

The FIGURE is a schematic structural diagram of the encapsulation thin film provided by the present disclosure.

The reference signs in the FIGURE is indicated as:

11—inorganic layer, 12—organic layer.

DETAILED DESCRIPTION OF THE EMBODIMENTS

The present disclosure provides a compound for an encapsulation thin film, having a structure shown in chemical structural formula 1:

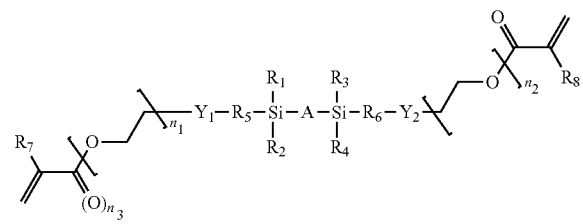

<Chemical structural formula 1> where A is an alkylamino group having 6 to 12 carbons or an alkoxy-substituted or unsubstituted aromatic group; $R_1$ to $R_4$ are the same or different alkyl groups having 1 to 6 carbons or aromatic groups; $R_5$ and $R_6$ are the same or different alkyl groups having 2 to 6 carbons or groups including 1 to 6 alkyl groups and a vinyloxy group; $R_7$ and $R_8$ are hydrogen or methyl; $n_1$ and $n_2$ are the same natural numbers; $n_3$ is 0 or 1; and $Y_1$ and $Y_2$ are the same or different, and are oxygen, alkyl substituted or unsubstituted amino or sulfur, or any one selected from the following chemical structural formulae 2 to 4;

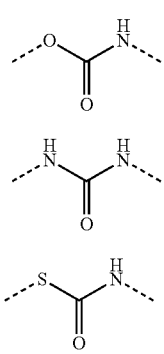

<Chemical structural formula 2>

<Chemical structural formula 3>

<Chemical structural formula 4>

The present disclosure also provides a composition comprising: component A, component B, and component C;

component A: the compound for an encapsulation thin film represented by chemical structural formula 1;

component B: one or more photocurable and thermocurable acryl-based compounds;

component C: one or more compounds that generate free radicals and acids upon exposure to light or heat.

The weight percentage of each component is as follows:

the weight percentage of the component A is: 9.5-90%;

the weight percentage of the component B is: 9.5-90%; and the weight percentage of the component C is: 0.5-10%.

This compound of chemical structural formula 1 can be used to produce a composition including one or more photocurable and thermocurable acryl-based compound alone or mixture thereof with another photocurable and thermocurable acryl-based compound, and one or more compounds that generate free radicals and acids upon exposure to light or heat or mixture thereof. Making use of its water vapor transmission rate of $9*10^{-2}$ g/m$^2$·day or less, the thin film layer formed by alternately stacking same or independent organic layers and inorganic layers once or more times. The inorganic layers used may be one or more of silicon nitride, silicon oxynitride, silicon oxide, aluminum oxide, zirconium oxide, titanium oxide, and zinc oxide, and the inorganic layers stacked may be different. The thin film layer thus produced can be directly applied onto the organic light-emitting device or can be made into a thin film form and attached thereon.

Therefore, the present disclosure also provides an encapsulation thin film, which is a thin film layer using the composition provided by the present disclosure and being formed by stacking under the following conditions;

It is a thin film layer formed by performing coating by laminating same or independent organic layers and inorganic layers once or more times;

the organic layer is the composition provided by the present disclosure; and the inorganic layer is formed of one or more of silicon nitride, silicon oxynitride, silicon oxide, aluminum oxide, zirconium oxide, titanium oxide, and zinc oxide, where the inorganic layers stacked may be different.

Preferably, the encapsulation thin film is a thin film layer with a water vapor transmission rate of $9*10^{-2}$ g/m²·day or less.

Preferably, the inorganic layer of the encapsulation thin film is arranged on one or two surfaces of the organic layer. The encapsulation thin film formed by arranging the inorganic layer on both surfaces of the organic layer is shown in the FIGURE. In the FIGURE, 11 represents an inorganic layer, and 12 represents an organic layer.

The encapsulation part is formed directly above an organic light-emitting device and a driving circuit formed on a substrate, and seals the organic light-emitting device and the driving circuit to protect them from external damage. The structure of this encapsulation part is usually of the thin film type, also called a thin film encapsulation layer.

(1) Organic Layer

In addition to the compounds of chemical structural formula 1 as detailed in claim 1, the organic layer can also use one or more photocurable or thermocurable monomer groups. This monomer or monomer group is mixed with a solid or liquid, a thermo- and photo-induced free radical initiator, and a thermo- and photo-induced acid generator, and the resulting mixture is applied by ink-jetting, electron spraying, electron emission, etc., and then irradiated by ultraviolet rays or heat cured to form the organic layer.

Although these monomer groups have at least one acrylic acid or titanium-based acrylic acid, they are not limited thereto. In the present disclosure, the encapsulation part is constituted differently depending on the thicknesses of the inorganic layer and the organic layer. The thickness relationship between the inorganic layer and the organic layer is set such that the thickness of the organic layer is greater than that of the inorganic layer.

Component B is a photocurable and thermocurable acryl-based compound, and examples thereof include one or more of 2-phenoxyethyl acrylic acid, 2-phenoxyethyl (meth) acrylic acid, 3-phenoxypropyl acrylic acid, 3-phenoxypropyl (meth)acrylic acid, 4-phenoxybutyl acrylic acid, 4-phenoxybutyl (meth)acrylic acid, 5-phenoxypentyl acrylic acid, 5-phenoxypentyl (meth)acrylic acid, 6-phenoxyhexyl acrylic acid, 6-phenoxyhexyl (meth)acrylic acid, 7-phenoxyheptyl acrylic acid, 7-phenoxyheptyl (meth)acrylic acid, 8-phenoxyoctyl acrylic acid, 8-phenoxyoctyl (meth) acrylic acid, 9-phenoxynonyl acrylic acid, 9-phenoxynonyl (meth)acrylic acid, 10-phenoxydecyl acrylic acid, 10-phenoxydecyl(meth)acrylic acid, 2-(thiophenyl)ethyl acrylic acid, 2-(thiophenyl)ethyl(meth)acrylic acid, 3-(thiophenyl) propyl acrylic acid, 3-(thiophenyl)propyl (meth)acrylic acid, 4-(thiophenyl)butyl acrylic acid, 4-(thiophenyl)butyl (meth) acrylic acid, 5-(thiophenyl)pentyl acrylic acid, 5-(thiophenyl)pentyl (meth)acrylic acid, 6-(thiophenyl)hexyl acrylic acid, 6-(thiophenyl)hexyl (meth)acrylic acid, 7-(thiophenyl) heptyl acrylic acid, 7-(thiophenyl)heptyl (meth)acrylic acid, 8-(thiophenyl)octyl acrylic acid, 8-(thiophenyl)octyl (meth) acrylic acid, 9-(thiophenyl)nonyl acrylic acid, 9-(thiophenyl)nonyl (meth)acrylic acid, 10-(thiophenyl)decyl acrylic acid, 10-(thiophenyl)decyl (meth)acrylic acid, 2-(naphthalen-2-yloxy)ethyl acrylic acid, 2-(naphthalen-2-yloxy)ethyl (meth)acrylic acid, 3-(naphthalen-2-yloxy)propyl acrylic acid, 3-(naphthalen-2-yloxy)propyl (meth)acrylic acid, 4-(naphthalen-2-yloxy)butyl acrylic acid, 4-(naphthalen-2-yloxy)butyl (meth)acrylic acid, 5-(naphthalen-2-yloxy)pentyl acrylic acid, 5-(naphthalen-2-yloxy)pentyl (meth)acrylic acid, 6-(naphthalen-2-yloxy)hexyl acrylic acid, 6-(naphthalen-2-yloxy)hexyl (meth)acrylic acid, 7-(naphthalen-2-yloxy)heptyl acrylic acid, 7-(naphthalen-2-yloxy)heptyl (meth)acrylic acid, 8-(naphthalen-2-yloxy)octyl acrylic acid, 8-(naphthalen-2-yloxy)octyl (meth)acrylate, 9-(naphthalen-2-yloxy)nonyl acrylate, 9-(naphthalen-2-yloxy)nonyl (meth)acrylate, 10-(naphthalene-2-yloxyyloxy)decyl acrylate, 10-(naphthalen-2-yloxy)decyl (meth)acrylate, 2-(naphthalene-2-)ethyl acrylate, 2-(naphthalen-2-ylthio)ethyl (meth)acrylate, 3-(naphthalen-2-ylthio)propyl acrylate, 3-(naphthalen-2-ylthio)propyl (meth)acrylate, 4-(naphthalen-2-ylthio)butylnaphthalene acrylate, 4-(naphthalen-2-ylthio)butyl (meth)acrylate, 5-(naphthalen-2-ylthio)pentyl acrylate, 5-(naphthalen-2-ylthio)ylnaphthalene (meth)acrylate, 6-(naphthalen-2-ylthio)hexylacrylate, 6-(naphthalen-2-ylthio)hexyl (meth)acrylate, 7-(naphthalen-2-ylthio)heptyl acrylate, 7-(naphthalen-2-ylthio)heptyl (meth)acrylate, 8-(naphthalen-2-ylthio)octyl acrylate, 8-(naphthalen-2-ylthio)octyl (meth)acrylate, 9-(naphthalen-2-ylthio)nonyl acrylate, 9-(naphthalen-2-ylthio)nonyl (meth)acrylate, 10-(naphthalen-2-ylthio)decyl acrylate, 10-(naphthalen-2-ylthio)decyl (meth)acrylate, 2-([1,1'-biphenyl]-4-yloxy)ethyl acrylate, 2-([1,1'-biphenyl]-4-yloxy)ethyl (meth)acrylate, 3-([1,1'-biphenyl]-4-yloxy)propyl acrylate, 3-([1,1'-biphenyl]-4-yloxy)propyl (meth)acrylate, 4-([1,1'-biphenyl]-4-yloxy)butyl acrylate, 4-([1,1'-biphenyl]-4-yloxy)butyl (meth)acrylate, 5-([1,1'-biphenyl]-4-yloxy)ylnaphthalene acrylate, 5-([1,1'-biphenyl]-4-yloxy)ylnaphthalene (meth)acrylate, 6-([1,1'-biphenyl]-4-yloxy)hexyl acrylate, 6-([1,1'-biphenyl]-4-yloxy)hexyl (meth)acrylate, 7-([1,1'-biphenyl]-4-yloxy)heptyl acrylate, 7-([1,1'-biphenyl]-4-yloxy)heptyl (meth)acrylate, 8-([1,1'-biphenyl]-4-yloxy)octyl acrylate, 8-([1,1'-biphenyl]-4-yloxy)octyl (meth)acrylate, 9-([1,1'-biphenyl]-4-yloxy)nonyl acrylate, 9-([1,1'-biphenyl]-4-yloxy) nonyl (meth)acrylate, 10-([1,1'-biphenyl]-4-yloxy)decyl acrylate, 10-([1,1'-biphenyl]-4-yloxy)decyl (meth)acrylate, 2-([1,1'-biphenyl]-4-ylthio)ethyl acrylate, 2-([1,1'-biphenyl]-4-ylthio)ethyl (meth)acrylate, 3-([1,1'-biphenyl]-4-ylthio)propyl acrylate, 3-([1,1'-biphenyl]-4-ylthio)propyl (meth)acrylate, 4-([1,1'-biphenyl]-4-ylthio)butyl acrylate, 4-([1,1'-biphenyl]-4-ylthio)butyl (meth)acrylate, 5-([1,1'-biphenyl]-4-ylthio)ylnaphthalene acrylate, 5-([1,1'-biphenyl]-4-ylthio)ylnaphthalene (meth)acrylate, 6-([1,1'-biphenyl]-4-ylthio)hexyl acrylate, 6-([1,1'-biphenyl]-4-ylthio)hexyl (meth)acrylate, 7-([1,1'-biphenyl]-4-ylthio)heptyl acrylate, 7-([1,1'-biphenyl]-4-ylthio)heptyl (meth)acrylate, 8-([1,1'-biphenyl]-4-ylthio)octyl acrylate, 8-([1,1'-biphenyl]-4-ylthio)octyl (meth)acrylate, 9-([1,1'-biphenyl]-4-ylthio)nonyl acrylate, 9-([1,1'-biphenyl]-4-ylthio)nonyl (meth)acrylate, 10-([1,1'-biphenyl]-4-ylthio)decyl acrylate, 10-([1,1'-biphenyl]-4-ylthio)decyl (meth)acrylate, 2-hydroxy-2-phenoxyethyl acrylate, 2-hydroxy-2-phenoxyethyl (meth)acrylate, 2-hydroxy-2-(naphthalen-2-yloxy)ethyl acrylate, 2-hydroxy-2-(naphthalen-2-yloxy)ethyl (meth)acrylate, 2-([1,1'-biphenyl]-4-yloxy)ethyl acrylate, 2-([1,1'-biphenyl]-4-yloxy)ethyl (meth)acrylate, 2-(2-phenoxyethoxy)ethyl acrylate, 2-(2-phenoxyethoxy)ethyl (meth)acrylate, 2-(phenoxymethoxy)ethyl acrylate, 2-(phenoxymethoxy)ethyl (meth)acrylate, 2-(([1,1'-biphenyl]-4-yloxy)methoxy)ethyl acrylate, 2-(([1,1'-biphenyl]-4-yloxy)methoxy)ethyl (meth) acrylate, 2-((naphthalen-2-yloxy)methoxy)ethyl acrylate, 2-((naphthalen-2-yloxy)methoxy)ethyl (meth)acrylate, 2-((thiophenyl)methoxy)ethyl acrylate, 2-((thiophenyl) methoxy)ethyl (meth)acrylate, 2-((naphthalen-2-ylthio) methoxy)ethyl acrylate, 2-((naphthalen-2-ylthio)methoxy) ethyl (meth)acrylate, 2,2'-(4,4'-(9H-fluorene-9,9-diyl)bis(4, 1-phenylene))bis(oxy)bis(ethane-2,1-diyl) diacrylate, 2,2'-(4,4'-(9H-fluorene-9,9-diyl)bis(4,1-phenylene))bis(oxy)bis (ethane-2,1-diyl) bis(2-methyl acrylate), 3,3'-(4,4'-(9H- fluorene-9,9-diyl)bis(4,1-phenylene))bis(oxy)bis(propane-3,1-diyl)diacrylate, 3,3'-(4,4'-(9H-fluorene-9,9-diyl)bis(4,1-phenylene))bis(oxy)bis(propane-3,1-diyl)bis(2-methyl acrylate), 2,2'-(4,4'-(9H-fluorene-9,9-diyl)bis(4,1-phenylene))bis(thiodiyl)bis(ethane-2,1-diyl) diacrylate, 2,2'-(4,4'-(9H-fluorene-9,9-diyl)bis(4,1-phenylene))bis(thiodiyl)bis(ethane-2,1-diyl)bis(2-methyl acrylate), 3,3'-(4,4'-(9H-fluorene-9,9-diyl)bis(4,1-phenylene))bis(thiodiyl)bis(propane-3,1-diyl)diacrylate, 3,3'-(4,4'-(9H-fluorene-9,9-diyl)bis(4,1-phenylene))bis(thiodiyl)bis(propane-3,1-diyl)bis(2-methyl acrylate), 2,2'-(4,4'-(4,4'-(9H-fluorene-9,9-diyl)bis(4,1-phenylene))bis(oxy)bis(4,1-phenylene))bis(oxy)bis(ethane-2,1-diyl)diacrylate, 2,2'-(4,4'-(4,4'-(9H-fluorene-9,9-diyl)bis(4,1-phenylene))bis(oxy)bis(4,1-phenylene))bis(oxy)bis(ethane-2,1-diyl)bis(2-methyl acrylate), 3,3'-(4,4'-(4,4'-(9H-fluorene-9,9-diyl)bis(4,1-phenylene))bis(oxy)bis(4,1-phenylene))bis(oxy)bis(propane-3,1-diyl)diacrylate, 3,3'-(4,4'-(4,4'-(9H-fluorene-9,9-diyl)bis(4,1-phenylene))bis(oxy)bis(4,1-phenylene))bis(oxy)bis(propane-3,1-diyl)bis(2-methyl acrylate), 2,2'-(4,4'-(4,4'-(9H-fluorene-9,9-diyl)bis(4,1-phenylene))bis(thiodiyl)bis(4,1-phenylene))bis(oxy)bis(ethane-2,1-diyl) diacrylate, 2,2'-(4,4'-(4,4'-(9H-fluorene-9,9-diyl)bis(4,1-phenylene))bis(thiodiyl)bis(4,1-phenylene))bis(oxy)bis(ethane-2,1-diyl)bis(2-methyl acrylate), 3,3'-(4,4'-(4,4'-(9H-fluorene-9,9-diyl)bis(4,1-phenylene))bis(thiodiyl)bis(4,1-phenylene))bis(oxy)bis(propane-3,1-diyl) diacrylate, 3,3'-(4,4'-(4,4'-(9H-fluorene-9,9-diyl)bis(4,1-phenylene))bis(thiodiyl)bis(4,1-phenylene))bis(oxy)bis(propane-3,1-diyl)bis(2-methyl acrylate), 2,2'-(2,2'-(4,4'-(9H-fluorene-9,9-diyl)bis(4,1-phenylene))bis(oxy)bis(ethane-2,1-diyl)bis(oxy)bis(ethane-2,-1diyl) diacrylate, 2,2'-(2,2'-(4,4'-(9H-fluorene-9,9-diyl)bis(4,1-phenylene))bis(oxy)bis(ethane-2,1-diyl))bis(oxy)bis(ethane-2,-1diyl)bis(2-methyl acrylate), 2,2'-(2,2'-(4,4'-(9H-fluorene-9,9-diyl)bis(4,1-phenylene))bis(thiodiyl)bis(ethane-2,1-diyl))bis(oxy)bis(ethane-2,-1diyl) diacrylate, 2,2'-(2,2'-(4,4'-(9H-fluorene-9,9-diyl)bis(4,1-phenylene))bis(thiodiyl)bis(ethane-2,1-diyl))bis(oxy)bis(ethane-2,-1diyl)bis(2-methyl acrylate), 2,2'-(4,4'-oxybis(4,1-phenylene)bis(oxy))bis(ethane-2,1-diyl) diacrylate, 2,2'-(4,4'-oxybis(4,1-phenylene)bis(oxy))bis(ethane-2,1-diyl)bis(2-methyl acrylate), 2,2'-(4,4'-oxybis(4,1-phenylene)bis(thiodiyl))bis(ethane-2,1-diyl) diacrylate, 2,2'-(4,4'-oxybis(4,1-phenylene)bis(thiodiyl))bis(ethane-2,1-diyl)bis(2-methyl acrylate), 2,2'-(4,4'-thiobis(4,1-phenylene)bis(oxy))bis(ethane-2,1-diyl) diacrylate, 2,2'-(4,4'-thiobis(4,1-phenylene)bis(oxy))bis(ethane-2,1-diyl)bis(2-methyl acrylate), 2,2'-(4,4'-thiobis(4,1-phenylene)bis(thiodiyl))bis(ethane-2,1-diyl) diacrylate, 2,2'-(4,4'-thiobis(4,1-phenylene)bis(thiodiyl))bis(ethane-2,1-diyl)bis(2-methyl acrylate), 2,2'-(3,3'-(4,4'-oxybis(4,1-phenylene)bis(oxy))bis(propane-3,1-diyl))bis(oxy)bis(ethane-2,1-diyl) diacrylate, 2,2'-(3,3'-(4,4'-oxybis(4,1-phenylene)bis(oxy))bis(propane-3,1-diyl))bis(oxy)bis(ethane-2,1-diyl)bis(2-methyl acrylate), 2,2'-(3,3'-(4,4'-thiobis(4,1-phenylene)bis(oxy))bis(propane-3,1-diyl))bis(oxy)bis(ethane-2,1-diyl) diacrylate, 2,2'-(3,3'-(4,4'-thiobis(4,1-phenylene)di(oxy))bis(propane-3,1-diyl))bis(oxy)bis(ethane-2,1-diyl)bis(2-methyl acrylate), 2,2'-(3,3'-(4,4'-oxybis(4,1-phenylene)bis(thiodiyl))bis(propane-3,1-diyl))bis(oxy)bis(ethane-2,1-diyl) diacrylate, 2,2'-(3,3'-(4,4'-oxybis(4,1-phenylene)bis(thiodiyl))bis(propane-3,1-diyl))bis(oxy)bis(ethane-2,1-diyl)bis(2-methyl acrylate), 2,2'-(3,3'-(4,4'-thiobis(4,1-phenylene)bis(thiodiyl))bis(propane-3,1-diyl))bis(oxy)bis(ethane-2,1-diyl) diacrylate, 2,2'-(4,4'-(propane-2,2-diyl)bis(4,1-phenylene))bis(oxy)bis(ethane-2,1-diyl) diacrylate, 2,2'-(4,4'-(propane-2,2-diyl)bis(4,1-phenylene))bis(oxy)bis(ethane-2,1-diyl)bis(2-methyl acrylate), 2,2'-(4,4'-(propane-2,2-diyl)bis(4,1-phenylene))bis(thiodiyl)bis(ethane-2,1-diyl) diacrylate, 2,2'-(4,4'-(propane-2,2-diyl)bis(4,1-phenylene))bis(thiodiyl)bis(ethane-2,1-diyl)bis(2-methyl acrylate), 2,2'-(2,2'-(4,4'-(propane-2,2-diyl)bis(4,1-phenylene))bis(oxy)bis(ethane-2,1-diyl))bis(oxy)bis(ethane-2,1-diyl) diacrylate, 2,2'-(2,2'-(4,4'-(propane-2,2-diyl)bis(4,1-phenylene))bis(oxy)bis(ethane-2,1-diyl))bis(oxy)bis(ethane-2,1-diyl)bis(2-methyl acrylate), 2,2'-(2,2'-(4,4'-(propane-2,2-diyl)bis(4,1-phenylene))bis(thiodiyl)bis(ethane-2,1-diyl))bis(oxy)bis(ethane-2,1-diyl) diacrylate, 2,2'-(2,2'-(4,4'-(propane-2,2-diyl)bis(4,1-phenylene))bis(thiodiyl)bis(ethane-2,1-diyl))bis(oxy)bis(ethane-2,1-diyl)bis(2-methyl acrylate), 2,2'-(2,2'-(2,2'-(4,4'-(propane-2,2-diyl)bis(4,1-phenylene))bis(oxy)bis(ethane-2,1-diyl))bis(oxy)bis(ethane-2,1-diyl))bis(oxy)bis(ethane-2,1-diyl) diacrylate, 2,2'-(2,2'-(2,2'-(4,4'-(propane-2,2-diyl)bis(4,1-phenylene))bis(oxy)bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-(propane-2,2-diyl)bis(4,1-phenylene))bis(thiodiyl)bis(ethane-2,1-diyl))bis(oxy)bis(ethane-2,1-diyl))bis(oxy)bis(ethane-2,1-diyl) diacrylate, 2,2'-(2,2'-(2,2'-(4,4'-(propane-2,2-diyl)bis(4,1-phenylene))bis(thiodiyl)bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-oxybis(4,1-phenylene)bis(oxy))bis(ethane-2,1-diyl))bis(oxy)bis(ethane-2,1-diyl))bis(oxy)bis(ethane-2,1-diyl) diacrylate, 2,2'-(2,2'-(2,2'-(4,4'-oxybis(4,1-phenylene)bis(oxy))bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-thiobis(4,1-phenylene)bis(oxy))bis(ethane-2,1-diyl))bis(oxy)bis(ethane-2,1-diyl))bis(oxy)bis(ethane-2,1-diyl) diacrylate, 2,2'-(2,2'-(2,2'-(4,4'-thiobis(4,1-phenylene)bis(oxy))bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-thiobis(4,1-phenylene)bis(thiodiyl))bis(ethane-2,1-diyl))bis(oxy)bis(ethane-2,1-diyl))bis(oxy)bis(ethane-2,1-diyl) diacrylate, 2,2'-(2,2'-(2,2'-(4,4'-thiobis(4,1-phenylene)bis(thiodiyl))bis(ethane-2,1-diyl))bis(oxy)bis(ethane-2,1-diyl))bis(oxy)bis(ethane-2,1-diyl)bis(2-methyl acrylate), polyester ethyl carbamate diacrylate, tripropylene glycol diacrylate, ethyl carbamate acrylate, epoxy resin acrylate, thiophenylethyl (meth)acrylate, isobornyl acrylate, phenoxyethyl(meth)acrylic acid, phenoxy-2-methyl-ethyl (meth)acrylic acid, phenoxyethoxyethyl (meth)acrylic acid, phenoxyphenyl acrylic acid, 3-phenoxy-2-hydroxylpropyl (meth)acrylate, 2-1-naphthoxyethyl (meth)acrylic acid, 2-2-naphthoxyethyl (meth)acrylic acid, 2-1-naphthylthioethyl (meth)acrylic acid, 2-2-naphthothioethyl (meth)acrylic acid, trimethylolpropyl triacrylate, 1,12-dodecanediol dimethacrylate, 1,6-hexanediol diacrylate, and 1,10-decanediol diacrylate.

When the compound of chemical formula 1 and the above-mentioned acrylic monomer mixture are used, the usage amount of both may be determined in consideration of the viscosity of the compound of chemical formula 1.

The component C is a photopolymerization initiator and/or a radical polymerization initiator; the photopolymerization initiator is a commonly used initiator in a photosensitive resin composition, and for example, acetophenone compounds, benzophenone compounds, thioxanthone compounds, benzoin compounds, triazine compounds, and the like can be used. Examples of the acetophenone compound includes 2,2-diethoxy-acetophenone, 2,2'-dibutoxyacetophenone, 2-hydroxy-2-methylpropiophenone, 4-tert-butyl trichloroacetophenone, 4-tert-butyl dichloroacetophenone, 4-chloroacetophenone, 2,2-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound includes benzophenone, benzoylbenzoic acid, methyl benzoylbenzoate, 4-phenylbenzophenone, hydroxybenzophenone, acrylic benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethylamino-2-methoxybenzophenone, and the like.

Examples of the thioxanthone compound include thioxanthone, 2-chlorothioxanthone, 2-methylthioxanthone, isopropylthioxanthone, 2,4-diethylthioxanthone, 2,4-diisopropyl thioxanthone, 2-chlorothioxanthone, and the like. Examples of the benzoin compound include benzoin, benzoin methyl ether, benzoin ethyl ether, benzoin isopropyl ether, benzoin isobutyl ether, benzyl dimethyl ketal, and the like.

Examples of the triazine compound include cyanuric chloride, 2-phenyl-4,6-bis(trichloromethyl)-s-triazine, 2-(3', 4'-dimethoxy styryl)-4,6-bis(trichloromethyl)-s-triazine, 2-(4'-methoxynaphthalene)-4,6-bis(trichloromethyl)-s-triazine, 2-(p-methoxyphenyl)-4,6-bis(trichloromethyl)-s-triazine, 2-(4-tolyl)-4,6-bis(trichloromethyl)-s-triazine, 2-diphenyl-4,6-bis(trichloromethyl)-s-triazine, bis(trichloromethyl)-6-styryl-s-triazine, 2-(naphthalen-1-yl)-4,6-bis(trichloromethyl)-s-triazine, 2-(4-methoxynaphthalen-1-yl)-4,6-bis(trichloromethyl)-s-triazine, 2-4-trichloromethyl(piperazinylcarbonyl)-6-triazine, 2-4-trichloromethyl(4'-methoxystyryl)-6-triazine, and the like.

As for the photoinitiator, in addition to the above-mentioned compounds, carbazole compounds, diketone compounds, sulfonium borate compounds, diazonium salt compounds, imidazole compounds, non-imidazole compounds, and the like can also be used.

As for the radical polymerization initiator, peroxide compounds, disazo compounds, and the like can be used.

Examples of the peroxide compound include ketone peroxides, such as methyl ethyl ketone peroxide, methyl isobutyl ketone peroxide, cyclohexanone peroxide, methyl cyclohexanone peroxide, and acetylacetone peroxide; diacyl peroxides, such as isobutyryl peroxide, 2,4-dichlorobenzoyl peroxide, o-methylbenzoyl peroxide, and di-3,5,5-trimethylhexanoyl peroxide; peroxides, such as 2,4,4-trimethylpentyl-2-hydroperoxide, diisopropylbenzene hydroperoxide, cumene peroxide, and tert-butyl peroxide; dialkyl peroxides, such as dicumyl peroxide, 2,5-dimethyl-2,5-di(tert-butylperoxy)hexane, 1,3-di(tert-butyloxyisopropyl)benzene, n-butyl tert-butylperoxyvalerate; alkyl peresters, such as 2,4,4-trimethyl pentyl peroxyphenoxyacetate, α-cumyl peroxyneodecanoate, tert-butyl peroxybenzoate, di-tert-butyl peroxytrimethyl adipate; and percarbonates, such as di-3-methoxybutyl peroxydicarbonate, di-2-ethylhexyl peroxydicarbonate, bis-4-tert-butylcyclohexyl peroxydicarbonate, diisopropyl peroxydicarbonate, acetylcyclohexylsulfonyl peroxide, tert-butylperoxyaryl carbonate.

Examples of the bisazo compound include 1,1'-azobiscyclohexane-1-carbonitrile, 2,2'-azobis(2,4-dimethylvaleronitrile), 2,2-azobis(methyl isobutyrate), 2,2'-azobis(4-methoxy-2,4-dimethylvaleronitrile), α,α'-azobis(isobutyronitrile), and 4,4'-azobis (4-cyanovaleric acid), and the like. The initiator above can be used together with a photosensitizer that undergoes chemical reactions by absorbing light to expand and then transfer energy. Examples of the photosensitizer include tetraethylene glycol bis-3-mercaptopropionate, pentaerythritol tetra-mercaptopropionate, dipentaerythritol tetra-3-mercaptopropionate, and the like.

The initiator above is used in a range of 0.5% to 10% by weight based on the total amount of the photosensitive resin composition. If the amount of the initiator is within the above-mentioned range, curing can be sufficiently performed upon exposure in the thin-film formation process, and thereby excellent reliability can be obtained. Although the decrease in transmission rate due to unreacted initiator can be prevented, it is not limited to the examples as described.

(2) Inorganic Layer

The inorganic layer is formed by sputtering CVD (Chemical Vapor Deposition), ALD (Atomic Layer Deposition), IBAD (Ion Beam Assisted Deposition), etc., by which oxides and nitrides of metal are formed.

For example, calcium oxides, aluminum oxides, titanium oxides, indium oxides, tin oxides, silicon oxides, silicon nitride, silicon oxynitride, aluminum nitride, zirconium oxide will form the selected substance, but it is not merely limited thereto.

Another example is production of an encapsulation film using the aforementioned composition. The production method of the encapsulation film is as follows. A reliable example of the present disclosure is noted, but the following example is only one of the reliable examples of the present disclosure, and it is not intended that the present disclosure is limited to the following example.

(3) Formation Stage of Coating Film and Coating

The aforementioned photosensitive resin composition was placed on a prescriptive preprocessed PEN (Poly Ethylene Naphthalene) substrate with a size of 6 cm×6 cm, and silicon nitride was vapor deposited by plasma chemical vapor deposition with moisture. Free ions used occurred by means of inductively coupled plasma. A precursor for vapor deposition and a reaction gas (trisilylamine, TSA) were supplied in a flow rate of 20 sccm and ammonia gas was supplied in a flow rate of 60 scc to the inside of the reactor, and argon gas was supplied as a carrier gas in a flow rate of 200 sccm. After the gas inside the reactor was sufficiently saturated, ammonia gas plasma was turned on, and then a silicon nitride thin film with a thickness of 250 nm was vapor-deposited in 0.4 torr for 12 minutes. The formation of a silicon nitride thin film with a thickness of 250 nm was confirmed by SEM (Scanning Electron Microscope).

The organic film was formed in the same manner as the following production examples 5-11. After formation of the organic film, the composition was sprayed for coating, and irradiated with 100 mW/cm² for about 10 seconds and then cured with UV to form a coating with a coating thickness of 3 μm. In a case of using a light source for exposure, high-pressure mercury or the like is used. A silicon nitride thin film of 250 mm was formed on the inorganic film on the organic film using the same method as that for coating the inorganic film.

<Production Example 1> Production of Compound 3 of Chemical Formula 7

In a 1000 mL three-necked flask attached to a refluxer, 50 g of compound 1 of chemical formula 5 (Gelest) and 34 g of allyl alcohol (Sigma-Aldrich) were dissolved in 500 mL of ethyl acetate (Sigma-Aldrich), which was then added in a reaction flask, and 0.3 g of a karstedt catalyst solution (Johnson Matthey Catalysts) of tetramethyldivinyldisiloxane was added to the reaction system, and then the reaction system was heated to 80° C. and refluxed under stirring for 4 hours. After the temperature was lowered to a normal temperature, the Pt catalyst was removed by filtration, and the solvent and residual allyl alcohol were removed by rotary distillation using a vacuum distillation apparatus to obtain 80 g of compound 2 of chemical formula 6. 80 g of the compound 2 was added to 600 mL of toluene (Sigma-Aldrich), 45 g of acrylic acid and 1 g of sulfuric acid were added therein, a water separator was installed in the reaction flask, the generated water was removed by heating and refluxing, and stirring was kept for 6 hours. After the completion of the reaction, the product was washed twice with 500 g of 10 wt % sodium hydroxide aqueous solution, and then washed twice with 500 g of distilled water. The organic layer was then distilled under a reduced pressure to obtain 110 g of compound 3 of chemical formula 7. MW: 418.34.

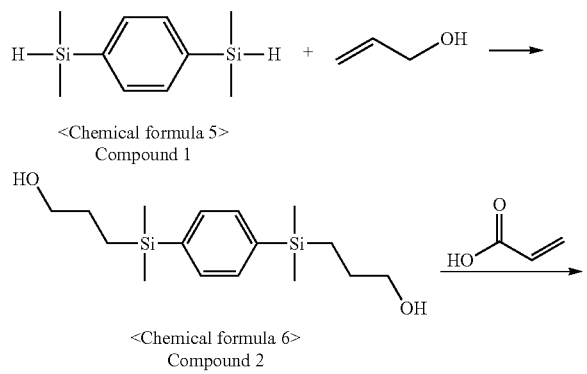

<Chemical formula 5>
Compound 1

<Chemical formula 6>
Compound 2

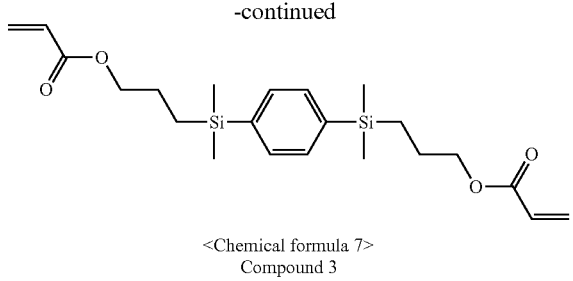

<Chemical formula 7>
Compound 3

<Production Examples 2, 3, 4> Compound 4 of Chemical Structural Formula 8, Compound 6 of Chemical Structural Formula 10, and Compound 8 of Chemical Structural Formula 12 were Produced.

As in the environment of Production Example 1, 33 g of allylamine (Sigma-Aldrich) was used in place of allyl alcohol to produce compound 5 of chemical structural formula 9, and 44 g of allyl mercaptan (Sigma-Aldrich) was used to synthesize compound 7 of chemical structural formula 11. Then, the compounds in the weight percentages in Table 1 below were used, and stirred at 50° C. for 4 hours. After the reaction is completed, compound 4 (MW: 592.61), compound 6 (590.38), and compound 8 (MW: 624.22) can be obtained.

TABLE 1

|  | Compound 2 | Compound 5 | Compound 7 | Isocyanate ethyl acrylate (TCI) | Toluene | Obtained amount |
| --- | --- | --- | --- | --- | --- | --- |
| Production example 2 (Compound 4) | 93 g |  |  | 86 g | 300 g | 175 g |
| Production example 3 (Compound 6) |  | 93 g |  | 86 g | 300 g | 174 g |
| Production example 4 (Compound 8) |  |  | 103 g | 86 g | 300 g | 185 g |

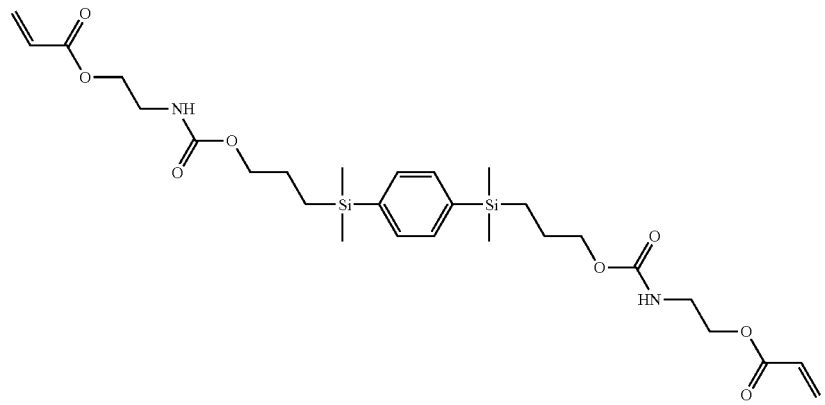

<Chemical structural formula 8>Compound 4

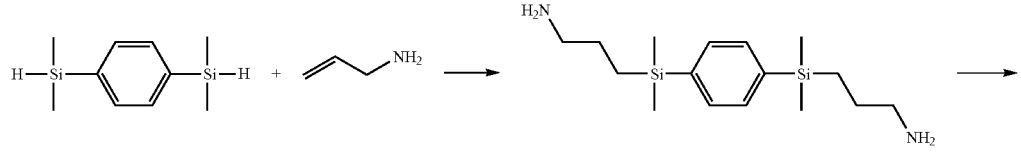

<Chemical structural formula 9>Compound 5

TABLE 1-continued

| Compound 2 | Compound 5 | Compound 7 | Isocyanate ethyl acrylate (TCI) | Toluene | Obtained amount |
|---|---|---|---|---|---|

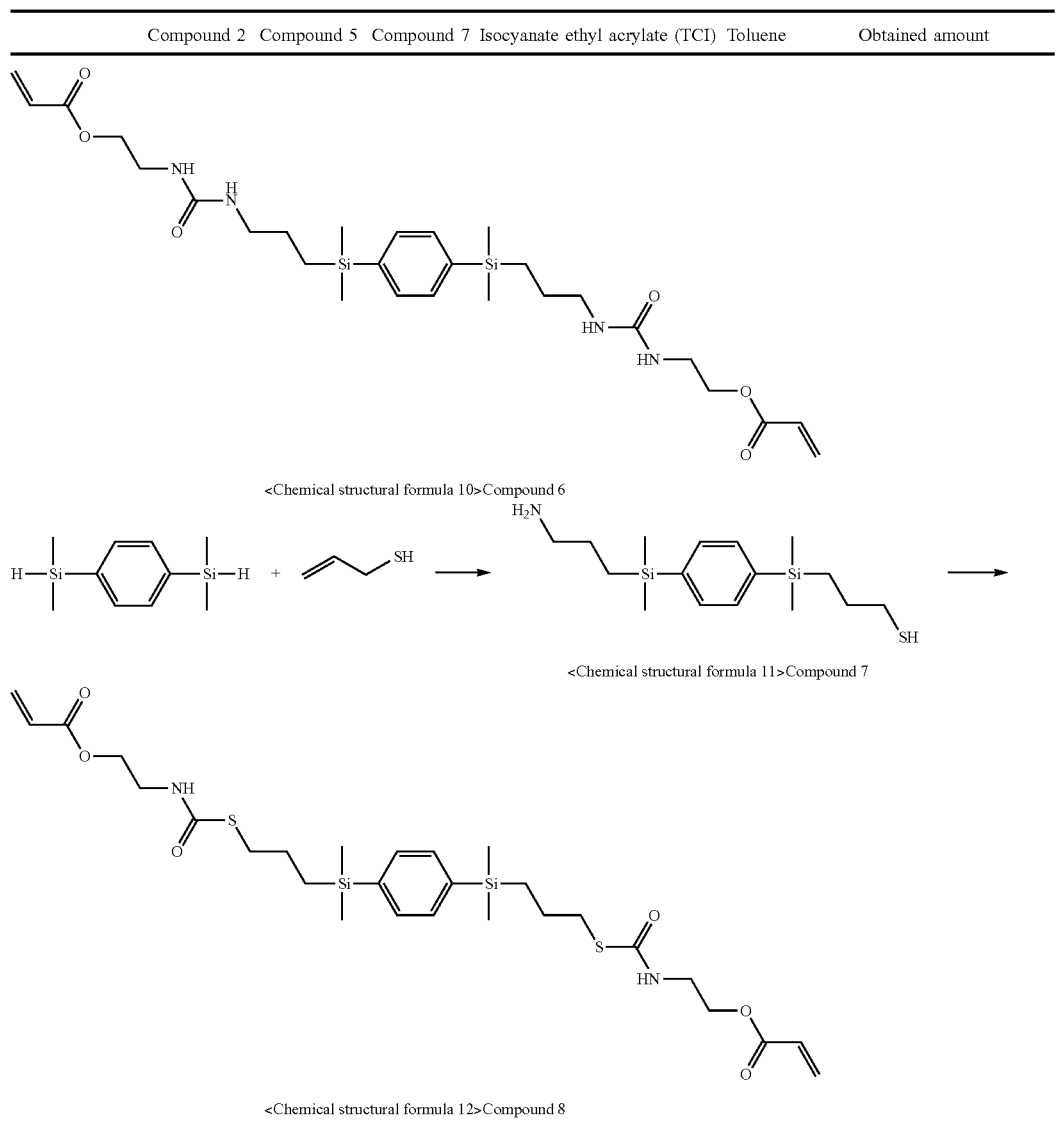

<Production Examples 5 to 11>

According to the compositions in Table 2, the compounds were fed into a reaction kettle and stirred for 30 minutes, and then filtered using a 0.45 μm Teflon syringe filter. For each composition, as shown in Table 3, it if formed on the PEN in a form of inorganic film (250 nm)/organic film (3 μm)/inorganic film (250 nm), and the water permeability of the encapsulation film was measured by a water permeability measuring instrument (AQUARAN2, MOCON). Measurements were performed at 37.8° C. and under a condition of 100% relative humidity for 24 hours.

TABLE 2

| | Production example 5 | Production example 6 | Production example 7 | Production example 8 | Production example 9 | Production example 10 | Production example 11 |
|---|---|---|---|---|---|---|---|
| Compound 3 of Production example 1 | 20 g | 10 g | — | — | — | — | — |
| Compound 4 of Production example 2 | — | — | 20 g | — | — | — | — |
| Compound 6 of Production example 3 | — | — | — | 20 g | — | — | — |

TABLE 2-continued

|  | Production example 5 | Production example 6 | Production example 7 | Production example 8 | Production example 9 | Production example 10 | Production example 11 |
|---|---|---|---|---|---|---|---|
| Compound 8 of Production example 4 | — | — | — | — | 20 g | — | — |
| 1,6-Hexanediol diacrylate (Aldrich) | 60 g | 60 g | 60 g | 60 g | 60 g | 80 g | 60 g |
| Isobornyl acrylate (Aldrich) | 17 g | 27 g | 17 g | 17 g | 17 g | 17 g | 37 g |
| BASF photoinitiator (BASF) | 3 g | 3 g | 3 g | 3 g | 3 g | 3 g | 3 g |

TABLE 3

|  | Example 1 | Example 2 | Example 3 | Example 4 | Example 5 | Comparative Example 1 | Comparative Example 2 |
|---|---|---|---|---|---|---|---|
| Inorganic film (250 nm) | Silicon nitride | Silicon nitride | Silicon nitride | Silicon nitride | Silicon nitride | Silicon nitride | Silicon nitride |
| Organic film (3 μm) | Production example 5 | Production example 6 | Production example 7 | Production example 8 | Production example 9 | Production example 10 | Production example 11 |
| Inorganic film (250 nm) | Silicon nitride | Silicon nitride | Silicon nitride | Silicon nitride | Silicon nitride | Silicon nitride | Silicon nitride |
| WVTR (g/m² · day) | $5 \times 10^{-4}$ | $3 \times 10^{-4}$ | $2.8 \times 10^{-4}$ | $3.1 \times 10^{-4}$ | $2.5 \times 10^{-4}$ | $1 \times 10^{-4}$ | $8 \times 10^{-3}$ |

In addition, after coating of 3 μm of the organic material, trisilyl amine and ammonia gas, which were inorganic precursors, were not fed into in a chemical vapor deposition chamber. Under the same conditions, the organic film was etched with argon plasma only, and then the Ra before and after plasma etching was measured by a high-resolution atomic force microscope (HR-AFM) (model NanoWizard Ultra Speed/JPK, Germany). The results are shown in Tables 4 and 5.

TABLE 4

|  | Example 1 | | Example 2 | | Comparative Example 1 | | Comparative Example 2 | |
|---|---|---|---|---|---|---|---|---|
|  | Front | Back | Front | Back | Front | Back | Front | Back |
| Plasma treatment $R_a$ (nm) | 5.1 | 9.6 | 4.6 | 12.3 | 4.4 | 26.5 | 4.9 | 35.3 |

TABLE 5

|  | Example 5 | | Comparative Example 1 | | Comparative Example 2 | |
|---|---|---|---|---|---|---|
|  | Front | Back | Front | Back | Front | Back |
| Plasma treatment $R_a$ (nm) | 4.3 | 12.5 | 4.4 | 26.5 | 4.9 | 35.3 |

As for the water vapor transmission rate of the encapsulation film prepared by laminating the inorganic/organic films under the same conditions as in Table 3, Example 1 using compound 3 of chemical formula 7 has the best effect. In the absence of compound 3, the value of Comparative Example 2, in which the valve of those combined is least, is the lowest. The reason can be understood according to the results before/after the plasma treatment as measured by atomic force microscope, that is, the results given in Table 3. Etching the surface with plasma, if the flatness is not good, would affect the inorganic film underneath it, thus lowering water vapor transmission rate.

The present disclosure is not limited to the above-mentioned examples and drawings, but can also be implemented in various forms. Those with basic knowledge in the technical field to which the present disclosure pertains will understand that the present disclosure can be extended into other specific forms without changing the technical idea of the present disclosure. Therefore, it can be understood that the above-mentioned examples and drawings are indicative in all respects but not restrictive.

The invention claimed is:

1. A compound for an encapsulation thin film, having a structure shown in chemical structural formula 1:

<Chemical structural formula 1>

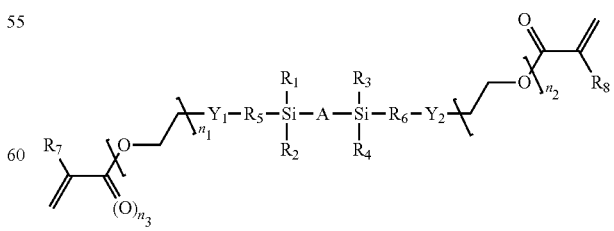

where

A is an alkylamino group having 6 to 12 carbons or an alkoxy-substituted or unsubstituted aromatic group;

R₁ to R₄ are same or different, and are alkyl groups having 1 to 6 carbons, or aromatic groups;
R₅ and R₆ are same or different alkyl groups having 2 to 6 carbons or groups comprising 1 to 6 alkyl groups and a vinyloxy group;
R₇ and R₈ are hydrogen or methyl;
n₁ and n₂ are same natural numbers;
n₃ is 1; and
Y₁ and Y₂ are any one selected from the group consisting of the following chemical structural formulae 3 to 4:

<Chemical structural formula 3>

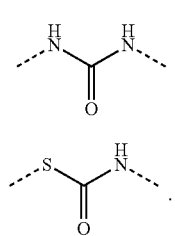

<Chemical structural formula 4>

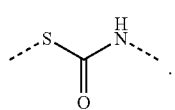

2. A composition comprising: a component A, a component B, and a component C;
wherein the component A comprises a compound for an encapsulation thin film structure shown in chemical structural formula 1:

<Chemical structural formula 1>

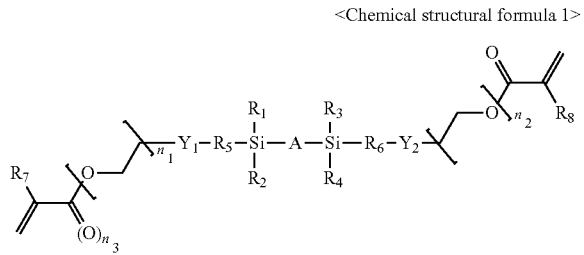

where
A is an alkylamino group having 6 to 12 carbons or an alkoxy-substituted or unsubstituted aromatic group;
R₁ to R₄ are same or different, and are alkyl groups having 1 to 6 carbons, or aromatic groups;
R₅ and R₆ are same or different alkyl groups having 2 to 6 carbons or groups comprising 1 to 6 alkyl groups and a vinyloxy group;
R₇ and R₈ are hydrogen or methyl;
n₁ and n₂ are same natural numbers;
n₃ is 1; and
Y₁ and Y₂ are any one selected from the group consisting of the following chemical structural formulae 3 to 4:

<Chemical structural formula 3>

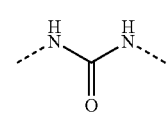

<Chemical structural formula 4>

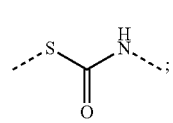

wherein the component B comprises one or more photocurable and thermocurable acryl-based compounds; and
wherein the component C comprises one or more compounds that generate free radicals and acids upon exposure to light or heat.

3. The composition according to claim 2, wherein weight percentages of the components are as follows:
the weight percentage of the component A is: 9.5-90%;
the weight percentage of the component B is: 9.5-90%; and
the weight percentage of the component C is: 0.5-10%.

4. The composition according to claim 2, wherein the component B is one or more selected from the group consisting of 2-phenoxyethyl acrylic acid, 2-phenoxyethyl (meth)acrylic acid, 3-phenoxypropyl acrylic acid, 3-phenoxypropyl (meth)acrylic acid, 4-phenoxybutyl acrylic acid, 4-phenoxybutyl (meth)acrylic acid, 5-phenoxypentyl acrylic acid, 5-phenoxypentyl (meth)acrylic acid, 6-phenoxyhexyl acrylic acid, 6-phenoxyhexyl (meth)acrylic acid, 7-phenoxyheptyl acrylic acid, 7-phenoxyheptyl (meth)acrylic acid, 8-phenoxyoctyl acrylic acid, 8-phenoxyoctyl (meth)acrylic acid, 9-phenoxynonyl acrylic acid, 9-phenoxynonyl (meth)acrylic acid, 10-phenoxydecyl acrylic acid, 10-phenoxydecyl (meth)acrylic acid, 2-(thiophenyl)ethyl acrylic acid, 2-(thiophenyl)ethyl (meth)acrylic acid, 3-(thiophenyl)propyl acrylic acid, 3-(thiophenyl)propyl (meth)acrylic acid, 4-(thiophenyl)butyl acrylic acid, 4-(thiophenyl)butyl (meth)acrylic acid, 5-(thiophenyl)pentyl acrylic acid, 5-(thiophenyl)pentyl (meth)acrylic acid, 6-(thiophenyl)hexyl acrylic acid, 6-(thiophenyl)hexyl (meth)acrylic acid, 7-(thiophenyl)heptyl acrylic acid, 7-(thiophenyl)heptyl (meth)acrylic acid, 8-(thiophenyl)octyl acrylic acid, 8-(thiophenyl)octyl (meth)acrylic acid, 9-(thiophenyl)nonyl acrylic acid, 9-(thiophenyl)nonyl (meth)acrylic acid, 10-(thiophenyl)decyl acrylic acid, 10-(thiophenyl)decyl (meth)acrylic acid, 2-(naphthalen-2-yloxy)ethyl acrylic acid, 2-(naphthalen-2-yloxy)ethyl (meth)acrylic acid, 3-(naphthalen-2-yloxy)propyl acrylic acid, 3-(naphthalen-2-yloxy)propyl (meth)acrylic acid, 4-(naphthalen-2-yloxy)butyl acrylic acid, 4-(naphthalen-2-yloxy)butyl (meth)acrylic acid, 5-(naphthalen-2-yloxy)pentyl acrylic acid, 5-(naphthalen-2-yloxy)pentyl (meth)acrylic acid, 6-(naphthalen-2-yloxy)hexyl acrylic acid, 6-(naphthalen-2-yloxy)hexyl (meth)acrylic acid, 7-(naphthalen-2-yloxy)heptyl acrylic acid, 7-(naphthalen-2-yloxy)heptyl (meth)acrylic acid, 8-(naphthalen-2-yloxy)octyl acrylic acid, 8-(naphthalen-2-yloxy)octyl (meth)acrylate, 9-(naphthalen-2-yloxy)nonyl acrylate, 9-(naphthalen-2-yloxy)nonyl (meth)acrylate, 10-(naphthalene-2-yloxyyloxy)decyl acrylate, 10-(naphthalen-2-yloxy)decyl (meth)acrylate, 2-(naphthalene-2-)ethyl acrylate, 2-(naphthalen-2-ylthio)ethyl (meth)acrylate, 3-(naphthalen-2-ylthio)propyl acrylate, 3-(naphthalen-2-ylthio)propyl (meth)acrylate, 4-(naphthalen-2-ylthio)butylnaphthalene acrylate, 4-(naphthalen-2-ylthio)butyl (meth)acrylate, 5-(naphthalen-2-ylthio)pentyl acrylate, 5-(naphthalen-2-ylthio)ylnaphthalene (meth)acrylate, 6-(naphthalen-2-ylthio)hexyl acrylate, 6-(naphthalen-2-ylthio)hexyl (meth)acrylate, 7-(naphthalen-2-ylthio)heptyl acrylate, 7-(naphthalen-2-ylthio)heptyl (meth)acrylate, 8-(naphthalen-2-ylthio)octyl acrylate, 8-(naphthalen-2-ylthio)octyl (meth)acrylate, 9-(naphthalen-2-ylthio)nonyl acrylate, 9-(naphthalen-2-ylthio)nonyl (meth)acrylate, 10-(naphthalen-2-ylthio)decyl acrylate, 10-(naphthalen-2-ylthio)decyl (meth)acrylate, 2-([1,1'-biphenyl]-4-yloxy)ethyl acrylate, 2-([1,1'-biphenyl]-4-yloxy)ethyl (meth)acrylate, 3-([1,1'-biphenyl]-4-yloxy)propyl acrylate, 3-([1,1'-biphenyl]-4-yloxy)propyl (meth)acrylate, 4-([1,1'-biphenyl]-4- yloxy)butyl acrylate, 4-([1,1'-biphenyl]-4-yloxy)butyl (meth)acrylate, 5-([1,1'-biphenyl]-4-yloxy)ylnaphthalene acrylate, 5-([1,1'-biphenyl]-4-yloxy)ylnaphthalene (meth) acrylate, 6-([1,1'-biphenyl]-4-yloxy)hexyl acrylate, 6-([1,1'-biphenyl]-4-yloxy)hexyl (meth)acrylate, 7-([1,1'-biphenyl]-4-yloxy)heptyl acrylate, 7-([1,1'-biphenyl]-4-yloxy)heptyl (meth)acrylate, 8-([1,1'-biphenyl]-4-yloxy)octyl acrylate, 8-([1,1'-biphenyl]-4-yloxy)octyl (meth)acrylate, 9-([1,1'-biphenyl]-4-yloxy)nonyl acrylate, 9-([1,1'-biphenyl]-4-yloxy) nonyl (meth)acrylate, 10-([1,1'-biphenyl]-4-yloxy)decyl acrylate, 10-([1,1'-biphenyl]-4-yloxy)decyl (meth)acrylate, 2-([1,1'-biphenyl]-4-ylthio)ethyl acrylate, 2([1,1'-biphenyl]-4-ylthio)ethyl (meth)acrylate, 3-([1,1'-biphenyl]-4-ylthio) propyl acrylate, 3-([1,1'-biphenyl]-4-ylthio)propyl (meth) acrylate, 4([1,1'-biphenyl]-4-ylthio)butyl acrylate, 4-([1,1'-biphenyl]-4-ylthio)butyl (meth)acrylate, 5([1,1'-biphenyl]-4-ylthio)ylnaphthalene acrylate, 5-([1,1'-biphenyl]-4-ylthio) ylnaphthalene (meth)acrylate, 6([1,1'-biphenyl]-4-ylthio) hexyl acrylate, 6([1,1'-biphenyl]-4-ylthio)hexyl (meth) acrylate, 7([1,1'-biphenyl]-4-ylthio)heptyl acrylate, 7([1,1'-biphenyl]-4-ylthio)heptyl (meth)acrylate, 8([1,1'-biphenyl]-4-ylthio)octyl acrylate, 8([1,1'-biphenyl]-4-ylthio)octyl (meth)acrylate, 9-([1,1'-biphenyl]-4-ylthio)nonyl acrylate, 9-([1,1'-biphenyl]-4-ylthio)nonyl (meth)acrylate, 10([1,1'-biphenyl]-4-ylthio)decyl acrylate, 10([1,1'-biphenyl]-4-ylthio)decyl (meth)acrylate, 2-hydroxy-2-phenoxyethyl acrylate, 2-hydroxy-2-phenoxyethyl (meth)acrylate, 2-hydroxy-2-(naphthalen-2-yloxy)ethyl acrylate, 2-hydroxy-2-(naphthalen-2-yloxy)ethyl (meth)acrylate, 2-([1,1'-biphenyl]-4-yloxy)ethyl acrylate, 2([1,1'-biphenyl]-4-yloxy) ethyl (meth)acrylate, 2-(2-phenoxyethoxy)ethyl acrylate, 2-(2-phenoxyethoxy)ethyl (meth)acrylate, 2-(phenoxymethoxy)ethyl acrylate, 2-(phenoxymethoxy)ethyl (meth)acrylate, 2-(([1,1'-biphenyl]-4-yloxy)methoxy)ethyl acrylate, 2([1,1'-biphenyl]-4-yloxy)methoxy)ethyl (meth) acrylate, 2-((naphthalen-2-yloxy)methoxy)ethyl acrylate, 2-((naphthalen-2-yloxy)methoxy)ethyl (meth)acrylate, 2-((thiophenyl)methoxy)ethyl acrylate, 2-((thiophenyl) methoxy)ethyl (meth)acrylate, 2-((naphthalen-2-ylthio) methoxy)ethyl acrylate, 2-((naphthalen-2-ylthio)methoxy) ethyl (meth)acrylate, 2,2'-(4,4'-(9H-fluorene-9,9-diyl)bis(4,1-phenylene))bis(oxy)bis(ethane-2,1-diyl)diacrylate, 2,2'-(4,4'-(9H-fluorene-9,9-diyl)bis(4,1-phenylene))bis(oxy)bis (ethane-2,1-diyl)bis(2-methyl acrylate), 3,3'-(4,4'-(9H-fluorene-9,9-diyl)bis(4,1-phenylene))bis(oxy)bis(propane-3,1-diyl)diacrylate, 3,3'-(4,4'-(9H-fluorene-9,9-diyl)bis(4,1-phenylene))bis(oxy)bis(propane-3,1-diyl)bis(2-methyl acrylate), 2,2'-(4,4'-(9H -fluorene-9,9-diyl)bis(4,1-phenylene))bis(thiodiyl)bis(ethane-2,1-diyl) diacrylate, 2,2'-(4,4'-(9H -fluorene-9,9-diyl)bis(4,1-phenylene))bis(thiodiyl) bis(ethane-2,1-diyl)bis(2-methyl acrylate), 3,3'-(4,4'-(9H-fluorene-9,9-diyl)bis(4,1-phenylene))bis(thiodiyl)bis (propane-3,1-diyl)diacrylate, 3,3'-(4,4'-(9H-fluorene-9,9-diyl)bis(4,1-phenylene))bis(thiodiyl)bis(propane-3,1-diyl) bis(2-methyl acrylate), 2,2'-(4,4'-(4,4'-(9H-fluorene-9,9-diyl)bis(4,1-phenylene))bis(oxy)bis(4,1-phenylene))bis (oxy)bis(ethane-2,1-diyl)diacrylate, 2,2'-(4,4'-(4,4'-(9H-fluorene-9,9-diyl)bis(4,1-phenylene))bis(oxy)bis(4,1-phenylene))bis(oxy)bis(ethane-2,1-diyl)bis(2-methyl acrylate), 3,3'-(4,4'-(4,4'-(9H-fluorene-9,9-diyl)bis(4,1-phenylene))bis(oxy)bis(4,1-phenylene))bis(oxy)bis(propane-3,1-diyl)diacrylate, 3,3'-(4,4'-(4,4'-(9H-fluorene-9,9-diyl)bis (4,1-phenylene))bis(oxy)bis(4,1-phenylene))bis(oxy)bis (propane-3,1-diyl)bis(2-methyl acrylate), 2,2'-(4,4'-(4,4'-(9H-fluorene-9,9-diyl)bis(4,1-phenylene))bis(thiodiyl)bis (4,1-phenylene))bis(oxy)bis(ethane-2,1-diyl) diacrylate, 2,2'-(4,4'-(4,4'-(9H-fluorene-9,9-diyl)bis(4,1-phenylene))bis (thiodiyl)bis(4,1-phenylene))bis(oxy)bis(ethane-2,1-diyl) bis(2-methyl acrylate), 3,3'-(4,4'-(4,4'-(9H-fluorene-9,9-diyl)bis(4,1-phenylene))bis(thiodiyl)bis(4,1-phenylene))bis (oxy)bis(propane-3,1-diyl) diacrylate, 3,3'-(4,4'-(4,4'-(9H-fluorene-9,9-diyl)bis(4,1-phenylene))bis(thiodiyl)bis(4,1-phenylene))bis(oxy)bis(propane-3,1-diyl)bis(2-methyl acrylate), 2,2'-(2,2'-(4,4'-(9H-fluorene-9,9-diyl)bis(4,1-phenylene))bis(oxy)bis(ethane-2,1-diyl))bis(oxy)bis(ethane-2,-1diyl) diacrylate, 2,2'-(2,2'-(4,4'-(9H-fluorene-9,9-diyl)bis (4,1-phenylene))bis(oxy)bis(ethane-2,1-diyl))bis(oxy)bis (ethane-2,-1diyl)bis(2-methyl acrylate), 2,2'-(2,2'-(4,4'-(9H-fluorene-9,9-diyl)bis(4,1-phenylene))bis(thiodiyl)bis (ethane-2,1-diyl))bis(oxy)bis(ethane-2,-1diyl) diacrylate, 2,2'-(2,2'-(4,4'-(9H-fluorene-9,9-diyl)bis(4,1-phenylene))bis (thiodiyl)bis(ethane-2,1-diyl))bis(oxy)bis(ethane-2,-1diyl) bis(2-methyl acrylate), 2,2'-(4,4'-oxybis(4,1-phenylene)bis (oxy))bis(ethane-2,1-diyl) diacrylate, 2,2'-(4,4'-oxybis(4,1-phenylene)bis(oxy))bis(ethane-2,1-diyl)bis(2-methyl acrylate), 2,2'-(4,4'-oxybis(4,1-phenylene)bis(thiodiyl))bis (ethane-2,1-diyl) diacrylate, 2,2'-(4,4'-oxybis(4,1-phenylene)bis(thiodiyl))bis(ethane-2,1-diyl)bis(2-methyl acrylate), 2,2'-(4,4'-thiobis(4,1-phenylene)bis(oxy))bis(ethane-2,1-diyl) diacrylate, 2,2'-(4,4'-thiobis(4,1-phenylene)bis (oxy))bis(ethane-2,1-diyl)bis(2-methyl acrylate), 2,2'-(4,4'-thiobis(4,1-phenylene)bis(thiodiyl))bis(ethane-2,1-diyl) diacrylate, 2,2'-(4,4'-thiobis(4,1-phenylene)bis(thiodiyl))bis (ethane-2,1-diyl)bis(2-methyl acrylate), 2,2'-(3,3'-(4,4'-oxybis(4,1-phenylene)bis(oxy))bis(propane-3,1-diyl))bis (oxy)bis(ethane-2,1-diyl) diacrylate, 2,2'-(3,3'-(4,4'-oxybis (4,1-phenylene)bis(oxy))bis(propane-3,1-diyl))bis(oxy)bis (ethane-2,1-diyl)bis(2-methyl acrylate), 2,2'-(3,3'-(4,4'-thiobis(4,1-phenylene)bis(oxy))bis(propane-3,1-diyl))bis (oxy)bis(ethane-2,1-diyl) diacrylate, 2,2'-(3,3'-(4,4'-thiobis (4,1-phenylene)di(oxy))bis(propane-3,1-diyl))bis(oxy)bis (ethane-2,1-diyl)bis(2-methyl acrylate), 2,2'-(3,3'-(4,4'-oxybis(4,1-phenylene)bis(thiodiyl))bis(propane-3,1-diyl)) bis(oxy)bis(ethane-2,1-diyl) diacrylate, 2,2'-(3,3'-(4,4'-oxybis(4,1-phenylene)bis(thiodiyl))bis(propane-3,1-diyl)) bis(oxy)bis(ethane-2,1-diyl)bis(2-methyl acrylate), 2,2'-(3, 3'-(4,4'-thiobis(4,1-phenylene)bis(thiodiyl))bis(propane-3, 1-diyl))bis(oxy)bis(ethane-2,1-diyl) diacrylate, 2,2'-(4,4'-(propane-2,2-diyl)bis(4,1-phenylene))bis(oxy)bis(ethane-2, 1-diyl) diacrylate, 2,2'-(4,4'-(propane-2,2-diyl)bis(4,1-phenylene))bis(oxy)bis(ethane-2,1-diyl) bis(2-methyl acrylate), 2,2'-(4,4'-(propane-2,2-diyl)bis(4,1-phenylene)) bis(thiodiyl)bis(ethane-2,1-diyl) diacrylate, 2,2'-(4,4'-(propane-2,2-diyl)bis(4,1-phenylene))bis(thiodiyl)bis(ethane-2, 1-diyl)bis(2-methyl acrylate), 2,2'-(2,2'-(4,4'-(propane-2,2-diyl)bis(4,1-phenylene))bis(oxy)bis(ethane-2,1-diyl))bis (oxy)bis(ethane-2,1-diyl) diacrylate, 2,2'-(2,2'-(4,4'-(propane-2,2-diyl)bis(4,1-phenylene))bis(oxy)bis(ethane-2, 1-diyl))bis(oxy)bis(ethane-2,1-diyl)bis(2-methyl acrylate), 2,2'-(2,2'-(4,4'-(propane-2,2-diyl)bis(4,1-phenylene))bis (thiodiyl)bis(ethane-2,1-diyl))bis(oxy)bis(ethane-2,1-diyl) diacrylate, 2,2'-(2,2'-(4,4'-(propane-2,2-diyl)bis(4,1-phenylene))bis(thiodiyl)bis(ethane-2,1-diyl))bis(oxy)bis(ethane-2,1-diyl)bis(2-methyl acrylate), 2,2'-(2,2'-(2,2'-(4,4'-(propane-2,2-diyl)bis(4,1-phenylene))bis(oxy)bis(ethane-2, 1-diyl)) bis(oxy)bis(ethane-2,1-diyl))bis(oxy)bis(ethane-2, 1-diyl) diacrylate, 2,2'-(2,2'-(2,2'-(4,4'-(propane-2,2-diyl) (4,1-phenylene)bis(oxy)bis(ethane-2,1-diyl))bis(oxy)bis (ethane-2,1-diyl))bis(oxy)bis(ethane-2,1-diyl)bis(2-methyl acrylate), 2,2'-(2,2'-(2,2'-(4,4'-(propane-2,2-diyl)bis(4,1-phenylene))bis(thiodiyl)bis(ethane-2,1-diyl))bis(oxy)bis (ethane-2,1-diyl))bis(oxy)bis(ethane-2,1-diyl) diacrylate, 2,2'-(2,2'-(2,2'-(4,4'-(propane-2,2-diyl)bis(4,1-phenylene)) bis(thiodiyl)bis(ethane-2,1-diyl))bis(oxy)bis(ethane-2,1- diyl))bis(oxy)bis(ethane-2,1-diyl)bis(2-methyl acrylate), 2,2'-(2,2'-(2,2'-(4,4'-oxybis(4,1-phenylene)bis(oxy))bis(ethane-2,1-diyl))bis(oxy)bis(ethane-2,1-diyl)bis(oxy)bis(ethane-2,1-diyl) diacrylate, 2,2'-(2,2'-(2,2'-(4,4'-oxybis(4,1-phenylene)bis(oxy))bis(ethane-2,1-diyl))bis(oxy)bis (ethane-2,1-diyl)bis(oxy)bis(ethane-2,1-diyl)bis(2-methyl acrylate), 2,2'-(2,2'-(2,2'-(4,4'-thiobis(4,1-phenylene)bis (oxy))bis(ethane-2,1-diyl))bis(oxy)bis(ethane-2,1-diyl)bis (oxy)bis(ethane-2,1-diyl) diacrylate, 2,2'-(2,2'-(2,2'-(4,4'-thiobis(4,1-phenylene)bis(oxy))bis(ethane-2,1-diyl))bis (oxy)bis(ethane-2,1-diyl)bis(oxy)bis(ethane-2,1-diyl)bis(2-methyl acrylate), 2,2'-(2,2'-(2,2'-(4,4'-thiobis(4,1-phenylene)bis(thiodiyl))bis(ethane-2,1-diyl)bis(oxy)bis (ethane-2,1-diyl))bis(oxy)bis(ethane-2,1-diyl) diacrylate, 2,2'-(2,2'-(2,2'-(4,4'-thiobis(4,1-phenylene)bis(thiodiyl))bis (ethane-2,1-diyl)bis(oxy)bis(ethane-2,1-diyl))bis(oxy)bis (ethane-2,1-diyl)bis(2-methyl acrylate), polyester ethyl carbamate diacrylate, tripropylene glycol diacrylate, ethyl carbamate acrylate, epoxy resin acrylate, thiophenylethyl (meth)acrylate, isobornyl acrylate, phenoxyethyl(meth) acrylic acid, phenoxy-2-methyl-ethyl (meth)acrylic acid, phenoxyethoxyethyl (meth)acrylic acid, phenoxyphenyl acrylic acid, 3-phenoxy-2-hydroxylpropyl (meth)acrylate, 2-1-naphthoxyethyl (meth)acrylic acid, 2-2-naphthoxyethyl (meth)acrylic acid, 2-1-naphthylthioethyl (meth)acrylic acid, 2-2-naphthothioethyl (meth)acrylic acid, trimethylolpropyl triacrylate, 1,12-dodecanediol dimethacrylate, 1,6-hexanediol diacrylate, and 1,10-decanediol diacrylate.

5. The composition according to claim 2, wherein the component C is a photopolymerization initiator and/or a free radical polymerization initiator; the photopolymerization initiator is one or more selected from the group consisting of an acetophenone compound, a benzophenone compound, a thioxanthone compound, a benzoin compound, a triazine compound, a carbazole compound, a diketone compound, a sulfonium borate compound, a diazonium salt compound, an imidazole compound, and a non-imidazole compound; and the free radical polymerization initiator is one or more selected from the group consisting of a peroxide compound and a bisazo compound.

6. An encapsulation thin film, wherein the encapsulation thin film is a thin film layer that is formed by performing coating by laminating same or independent organic layers and inorganic layers one or more times;
the organic layer is the composition according to claim 2; and
the inorganic layer is formed of one or more selected from the group consisting of silicon nitride, silicon oxynitride, silicon oxide, aluminum oxide, zirconium oxide, titanium oxide, and zinc oxide.

7. The encapsulation thin film according to claim 6, wherein the encapsulation thin film is a thin film layer with a hygroscopic degree of $9*10^{-2}$ g/m²·day or less.

8. The encapsulation thin film according to claim 6, wherein the inorganic layer of the encapsulation thin film is arranged on one or two surfaces of the organic layer.

9. The composition according to claim 3, wherein the component B is one or more selected from the group consisting of 2-phenoxyethyl acrylic acid, 2-phenoxyethyl (meth)acrylic acid, 3-phenoxypropyl acrylic acid, 3-phenoxypropyl (meth)acrylic acid, 4-phenoxybutyl acrylic acid, 4-phenoxybutyl (meth)acrylic acid, 5-phenoxypentyl acrylic acid, 5-phenoxypentyl (meth)acrylic acid, 6-phenoxyhexyl acrylic acid, 6-phenoxyhexyl (meth)acrylic acid, 7-phenoxyheptyl acrylic acid, 7-phenoxyheptyl (meth)acrylic acid, 8-phenoxyoctyl acrylic acid, 8-phenoxyoctyl (meth) acrylic acid, 9-phenoxynonyl acrylic acid, 9-phenoxynonyl (meth)acrylic acid, 10-phenoxydecyl acrylic acid, 10-phenoxydecyl (meth)acrylic acid, 2-(thiophenyl)ethyl acrylic acid, 2-(thiophenyl)ethyl (meth)acrylic acid, 3-(thiophenyl) propyl acrylic acid, 3-(thiophenyl)propyl (meth)acrylic acid, 4-(thiophenyl)butyl acrylic acid, 4-(thiophenyl)butyl (meth) acrylic acid, 5-(thiophenyl)pentyl acrylic acid, 5-(thiophenyl)pentyl (meth)acrylic acid, 6-(thiophenyl)hexyl acrylic acid, 6-(thiophenyl)hexyl (meth)acrylic acid, 7-(thiophenyl) heptyl acrylic acid, 7-(thiophenyl)heptyl (meth)acrylic acid, 8-(thiophenyl)octyl acrylic acid, 8-(thiophenyl)octyl (meth) acrylic acid, 9-(thiophenyl)nonyl acrylic acid, 9-(thiophenyl)nonyl (meth)acrylic acid, 10-(thiophenyl)decyl acrylic acid, 10-(thiophenyl)decyl (meth)acrylic acid, 2-(naphthalen-2-yloxy)ethyl acrylic acid, 2-(naphthalen-2-yloxy)ethyl (meth)acrylic acid, 3-(naphthalen-2-yloxy)propyl acrylic acid, 3-(naphthalen-2-yloxy)propyl (meth)acrylic acid, 4-(naphthalen-2-yloxy)butyl acrylic acid, 4-(naphthalen-2-yloxy)butyl (meth)acrylic acid, 5-(naphthalen-2-yloxy)pentyl acrylic acid, 5-(naphthalen-2-yloxy)pentyl (meth)acrylic acid, 6-(naphthalen-2-yloxy)hexyl acrylic acid, 6-(naphthalen-2-yloxy)hexyl (meth)acrylic acid, 7-(naphthalen-2-yloxy)heptyl acrylic acid, 7-(naphthalen-2-yloxy)heptyl (meth)acrylic acid, 8-(naphthalen-2-yloxy)octyl acrylic acid, 8-(naphthalen-2-yloxy)octyl (meth)acrylic acid, 9-(naphthalen-2-yloxy)nonyl acrylate, 9-(naphthalen-2-yloxy)nonyl (meth)acrylate, 10-(naphthalene-2-yloxyyloxy)decyl acrylate, 10-(naphthalen-2-yloxy)decyl (meth)acrylate, 2-(naphthalene-2-)ethyl acrylate, 2-(naphthalen-2-ylthio)ethyl (meth)acrylate, 3-(naphthalen-2-ylthio)propyl acrylate, 3-(naphthalen-2-ylthio)propyl (meth)acrylate, 4-(naphthalen-2-ylthio)butylnaphthalene acrylate, 4-(naphthalen-2-ylthio)butyl (meth)acrylate, 5-(naphthalen-2-ylthio)pentyl acrylate, 5-(naphthalen-2-ylthio)ylnaphthalene (meth)acrylate, 6-(naphthalen-2-ylthio)hexyl acrylate, 6-(naphthalen-2-ylthio)hexyl (meth)acrylate, 7-(naphthalen-2-ylthio)heptyl acrylate, 7-(naphthalen-2-ylthio)heptyl (meth)acrylate, 8-(naphthalen-2-ylthio)octyl acrylate, 8-(naphthalen-2-ylthio)octyl (meth)acrylate, 9-(naphthalen-2-ylthio)nonyl acrylate, 9-(naphthalen-2-ylthio)nonyl (meth)acrylate, 10-(naphthalen-2-ylthio)decyl acrylate, 10-(naphthalen-2-ylthio)decyl (meth)acrylate, 2-([1,1'-biphenyl]-4-yloxy)ethyl acrylate, 2-([1,1'-biphenyl]-4-yloxy)ethyl (meth)acrylate, 3-([1,1'-biphenyl]-4-yloxy)propyl acrylate, 3-([1,1'-biphenyl]-4-yloxy)propyl (meth)acrylate, 4-([1,1'-biphenyl]-4-yloxy)butyl acrylate, 4-([1,1'-biphenyl]-4-yloxy)butyl (meth)acrylate, 5-([1,1'-biphenyl]-4-yloxy)ylnaphthalene acrylate, 5-([1,1'-biphenyl]-4-yloxy)ylnaphthalene (meth)acrylate, 6-([1,1'-biphenyl]-4-yloxy)hexyl acrylate, 6-([1,1'-biphenyl]-4-yloxy)hexyl (meth)acrylate, 7-([1,1'-biphenyl]-4-yloxy)heptyl acrylate, 7-([1,1'-biphenyl]-4-yloxy)heptyl (meth)acrylate, 8-([1,1'-biphenyl]-4-yloxy)octyl acrylate, 8-([1,1'-biphenyl]-4-yloxy)octyl (meth)acrylate, 9-([1,1'-biphenyl]-4-yloxy)nonyl acrylate, 9-([1,1'-biphenyl]-4-yloxy) nonyl (meth)acrylate, 10-([1,1'-biphenyl]-4-yloxy)decyl acrylate, 10-([1,1'-biphenyl]-4-yloxy)decyl (meth)acrylate, 2-([1,1'-biphenyl]-4-ylthio)ethyl acrylate, 2-([1,1'-biphenyl]-4-ylthio)ethyl (meth)acrylate, 3-([1,1'-biphenyl]-4-ylthio)propyl acrylate, 3-([1,1'-biphenyl]-4-ylthio)propyl (meth)acrylate, 4-([1,1'-biphenyl]-4-ylthio)butyl acrylate, 4-([1,1'-biphenyl]-4-ylthio)butyl (meth)acrylate, 5-([1,1'-biphenyl]-4-ylthio)ylnaphthalene acrylate, 5-([1,1'-biphenyl]-4-ylthio)ylnaphthalene (meth)acrylate, 6-([1,1'-biphenyl]-4-ylthio)hexyl acrylate, 6-([1,1'-biphenyl]-4-ylthio)hexyl (meth)acrylate, 7-([1,1'-biphenyl]-4-ylthio)heptyl acrylate, 7-([1,1'-biphenyl]-4-ylthio)heptyl (meth)acrylate, 8-([1,1'-biphenyl]-4-ylthio)octyl acrylate, 8-([1,1'-biphenyl]-4-ylthio)octyl (meth)acrylate, 9-([1,1'-biphenyl]-4-ylthio)nonyl acrylate, 9-([1,1'-biphenyl]-4-ylthio)nonyl (meth)acrylate, 10-([1,1'-biphenyl]-4-ylthio)decyl acrylate, 10-([1,1'-biphenyl]-4-ylthio)decyl (meth)acrylate, 2-hydroxy-2-phenoxyethyl acrylate, 2-hydroxy-2-phenoxyethyl (meth)acrylate, 2-hydroxy-2-(naphthalen-2-yloxy)ethyl acrylate, 2-hydroxy-2-(naphthalen-2-yloxy)ethyl (meth)acrylate, 2-([1,1'-biphenyl]-4-yloxy)ethyl acrylate, 2-([1,1'-biphenyl]-4-yloxy)ethyl (meth)acrylate, 2-(2-phenoxyethoxy)ethyl acrylate, 2-(2-phenoxyethoxy)ethyl (meth)acrylate, 2-(phenoxymethoxy)ethyl acrylate, 2-(phenoxymethoxy)ethyl (meth)acrylate, 2-(([1,1'-biphenyl]-4-yloxy)methoxy)ethyl acrylate, 2-(([1,1'-biphenyl]-4-yloxy)methoxy)ethyl (meth)acrylate, 2-((naphthalen-2-yloxy)methoxy)ethyl acrylate, 2-((naphthalen-2-yloxy)methoxy)ethyl (meth)acrylate, 2-((thiophenyl)methoxy)ethyl acrylate, 2-((thiophenyl)methoxy)ethyl (meth)acrylate, 2-((naphthalen-2-ylthio)methoxy)ethyl acrylate, 2-((naphthalen-2-ylthio)methoxy)ethyl (meth)acrylate, 2,2'-(4,4'-(9H-fluorene-9,9-diyl)bis(4,1-phenylene))bis(oxy)bis(ethane-2,1-diyl)diacrylate, 2,2'-(4,4'-(9H-fluorene-9,9-diyl)bis(4,1-phenylene))bis(oxy)bis(ethane-2,1-diyl)bis(2-methyl acrylate), 3,3'-(4,4'-(9H-fluorene-9,9-diyl)bis(4,1-phenylene))bis(oxy)bis(propane-3,1-diyl)diacrylate, 3,3'-(4,4'-(9H-fluorene-9,9-diyl)bis(4,1-phenylene))bis(oxy)bis(propane-3,1-diyl)bis(2-methyl acrylate), 2,2'-(4,4'-(9H-fluorene-9,9-diyl)bis(4,1-phenylene))bis(thiodiyl)bis(ethane-2,1-diyl) diacrylate, 2,2'-(4,4'-(9H-fluorene-9,9-diyl)bis(4,1-phenylene))bis(thiodiyl)bis(ethane-2,1-diyl)bis(2-methyl acrylate), 3,3'-(4,4'-(9H-fluorene-9,9-diyl)bis(4,1-phenylene))bis(thiodiyl)bis(propane-3,1-diyl)diacrylate, 3,3'-(4,4'-(9H-fluorene-9,9-diyl)bis(4,1-phenylene))bis(thiodiyl)bis(propane-3,1-diyl)bis(2-methyl acrylate), 2,2'-(4,4'-(4,4'-(9H-fluorene-9,9-diyl)bis(4,1-phenylene))bis(oxy)bis(4,1-phenylene))bis(oxy)bis(ethane-2,1-diyl)diacrylate, 2,2'-(4,4'-(4,4'-(9H-fluorene-9,9-diyl)bis(4,1-phenylene))bis(oxy)bis(4,1-phenylene))bis(oxy)bis(ethane-2,1-diyl)bis(2-methyl acrylate), 3,3'-(4,4'-(4,4'-(9H-fluorene-9,9-diyl)bis(4,1-phenylene))bis(oxy)bis(4,1-phenylene))bis(oxy)bis(propane-3,1-diyl)diacrylate, 3,3'-(4,4'-(4,4'-(9H-fluorene-9,9-diyl)bis(4,1-phenylene))bis(oxy)bis(4,1-phenylene))bis(oxy)bis(propane-3,1-diyl)bis(2-methyl acrylate), 2,2'-(4,4'-(4,4'-(9H-fluorene-9,9-diyl)bis(4,1-phenylene))bis(thiodiyl)bis(4,1-phenylene))bis(oxy)bis(ethane-2,1-diyl) diacrylate, 2,2'-(4,4'-(4,4'-(9H-fluorene-9,9-diyl)bis(4,1-phenylene))bis(thiodiyl)bis(4,1-phenylene))bis(oxy)bis(ethane-2,1-diyl)bis(2-methyl acrylate), 3,3'-(4,4'-(4,4'-(9H-fluorene-9,9-diyl)bis(4,1-phenylene))bis(thiodiyl)bis(4,1-phenylene))bis(oxy)bis(propane-3,1-diyl) diacrylate, 3,3'-(4,4'-(4,4'-(9H-fluorene-9,9-diyl)bis(4,1-phenylene))bis(thiodiyl)bis(4,1-phenylene))bis(oxy)bis(propane-3,1-diyl)bis(2-methyl acrylate), 2,2'-(2,2'-(4,4'-(9H-fluorene-9,9-diyl)bis(4,1-phenylene))bis(oxy)bis(ethane-2,1-diyl))bis(oxy)bis(ethane-2,-1diyl) diacrylate, 2,2'-(2,2'-(4,4'-(9H-fluorene-9,9-diyl)bis(4,1-phenylene))bis(oxy)bis(ethane-2,1-diyl))bis(oxy)bis(ethane-2,-1diyl)bis(2-methyl acrylate), 2,2'-(2,2'-(4,4'-(9H-fluorene-9,9-diyl)bis(4,1-phenylene))bis(thiodiyl)bis(ethane-2,1-diyl))bis(oxy)bis(ethane-2,-1diyl) diacrylate, 2,2'-(2,2'-(4,4'-(9H-fluorene-9,9-diyl)bis(4,1-phenylene))bis(thiodiyl)bis(ethane-2,1-diyl))bis(oxy)bis(ethane-2,-1diyl)bis(2-methyl acrylate), 2,2'-(4,4'-oxybis(4,1-phenylene)bis(oxy))bis(ethane-2,1-diyl) diacrylate, 2,2'-(4,4'-oxybis(4,1-phenylene)bis(oxy))bis(ethane-2,1-diyl)bis(2-methyl acrylate), 2,2'-(4,4'-oxybis(4,1-phenylene)bis(thiodiyl))bis(ethane-2,1-diyl) diacrylate, 2,2'-(4,4'-oxybis(4,1-phenylene)bis(thiodiyl))bis(ethane-2,1-diyl)bis(2-methyl acrylate), 2,2'-(4,4'-thiobis(4,1-phenylene)bis(oxy))bis(ethane-2,1-diyl) diacrylate, 2,2'-(4,4'-thiobis(4,1-phenylene)bis(oxy))bis(ethane-2,1-diyl)bis(2-methyl acrylate), 2,2'-(4,4'-thiobis(4,1-phenylene)bis(thiodiyl))bis(ethane-2,1-diyl) diacrylate, 2,2'-(4,4'-thiobis(4,1-phenylene)bis(thiodiyl))bis(ethane-2,1-diyl)bis(2-methyl acrylate), 2,2'-(3,3'-(4,4'-oxybis(4,1-phenylene)bis(oxy))bis(propane-3,1-diyl))bis(oxy)bis(ethane-2,1-diyl) diacrylate, 2,2'-(3,3'-(4,4'-oxybis(4,1-phenylene)bis(oxy))bis(propane-3,1-diyl))bis(oxy)bis(ethane-2,1-diyl)bis(2-methyl acrylate), 2,2'-(3,3'-(4,4'-thiobis(4,1-phenylene)bis(oxy))bis(propane-3,1-diyl))bis(oxy)bis(ethane-2,1-diyl) diacrylate, 2,2'-(3,3'-(4,4'-thiobis(4,1-phenylene)di(oxy))bis(propane-3,1-diyl))bis(oxy)bis(ethane-2,1-diyl)bis(2-methyl acrylate), 2,2'-(3,3'-(4,4'-oxybis(4,1-phenylene)bis(thiodiyl))bis(propane-3,1-diyl))bis(oxy)bis(ethane-2,1-diyl) diacrylate, 2,2'-(3,3'-(4,4'-oxybis(4,1-phenylene)bis(thiodiyl))bis(propane-3,1-diyl))bis(oxy)bis(ethane-2,1-diyl)bis(2-methyl acrylate), 2,2'-(3,3'-(4,4'-thiobis(4,1-phenylene)bis(thiodiyl))bis(propane-3,1-diyl))bis(oxy)bis(ethane-2,1-diyl) diacrylate, 2,2'-(4,4'-(propane-2,2-diyl)bis(4,1-phenylene))bis(oxy)bis(ethane-2,1-diyl) diacrylate, 2,2'-(4,4'-(propane-2,2-diyl)bis(4,1-phenylene))bis(oxy)bis(ethane-2,1-diyl) bis(2-methyl acrylate), 2,2'-(4,4'-(propane-2,2-diyl)bis(4,1-phenylene))bis(thiodiyl)bis(ethane-2,1-diyl) diacrylate, 2,2'-(4,4'-(propane-2,2-diyl)bis(4,1-phenylene))bis(thiodiyl)bis(ethane-2,1-diyl)bis(2-methyl acrylate), 2,2'-(2,2'-(4,4'-(propane-2,2-diyl)bis(4,1-phenylene))bis(oxy)bis(ethane-2,1-diyl))bis(oxy)bis(ethane-2,1-diyl) diacrylate, 2,2'-(2,2'-(4,4'-(propane-2,2-diyl)bis(4,1-phenylene))bis(oxy)bis(ethane-2,1-diyl))bis(oxy)bis(ethane-2,1-diyl)bis(2-methyl acrylate), 2,2'-(2,2'-(4,4'-(propane-2,2-diyl)bis(4,1-phenylene))bis(thiodiyl)bis(ethane-2,1-diyl))bis(oxy)bis(ethane-2,1-diyl) diacrylate, 2,2'-(2,2'-(4,4'-(propane-2,2-diyl)bis(4,1-phenylene))bis(thiodiyl)bis(ethane-2,1-diyl))bis(oxy)bis(ethane-2,1-diyl)bis(2-methyl acrylate), 2,2'-(2,2'-(2,2'-(4,4'-(propane-2,2-diyl)bis(4,1-phenylene))bis(oxy)bis(ethane-2,1-diyl)) bis(oxy)bis(ethane-2,1-diyl))bis(oxy)bis(ethane-2,1-diyl) diacrylate, 2,2'-(2,2'-(2,2'-(4,4'-(propane-2,2-diyl)bis(4,1-phenylene))bis(oxy)bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-(propane-2,2-diyl)bis(4,1-phenylene))bis(thiodiyl)bis(ethane-2,1-diyl))bis(oxy)bis(ethane-2,1-diyl))bis(oxy)bis(ethane-2,1-diyl) diacrylate, 2,2'-(2,2'-(2,2'-(4,4'-(propane-2,2-diyl)bis(4,1-phenylene)) bis(thiodiyl)bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-oxybis(4,1-phenylene)bis(oxy))bis(ethane-2,1-diyl))bis(oxy)bis(ethane-2,1-diyl)bis(oxy)bis(ethane-2,1-diyl) diacrylate, 2,2'-(2,2'-(2,2'-(4,4'-oxybis(4,1-phenylene)bis(oxy))bis(ethane-2,1-diyl))bis(oxy)bis(ethane-2,1-diyl))bis(oxy)bis(ethane-2,1-diyl)bis(2-methyl acrylate), 2,2'-(2,2'-(2,2'-(4,4'-thiobis(4,1-phenylene)bis(oxy))bis(ethane-2,1-diyl))bis(oxy)bis(ethane-2,1-diyl)bis(oxy)bis(ethane-2,1-diyl) diacrylate, 2,2'-(2,2'-(2,2'-(4,4'-thiobis(4,1-phenylene)bis(oxy))bis(ethane-2,1-diyl))bis(oxy)bis(ethane-2,1-diyl)bis(oxy)bis(ethane-2,1-diyl)bis(2-methyl acrylate), 2,2'-(2,2'-(2,2'-(4,4'-thiobis(4,1-phenylene)bis(thiodiyl))bis(ethane-2,1-diyl))bis(oxy)bis(ethane-2,1-diyl))bis(oxy)bis(ethane-2,1-diyl) diacrylate, 2,2'-(2,2'-(2,2'-(4,4'-thiobis(4,1-phenylene)bis(thiodiyl))bis(ethane-2,1-diyl))bis(oxy)bis(ethane-2,1-diyl))bis(oxy)bis(ethane-2,1-diyl)bis(2-methyl acrylate), polyester ethyl carbamate diacrylate, tripropylene glycol diacrylate, ethyl carbamate acrylate, epoxy resin acrylate, thiophenylethyl (meth)acrylate, isobornyl acrylate, phenoxyethyl(meth) acrylic acid, phenoxy-2-methyl-ethyl (meth)acrylic acid, phenoxyethoxyethyl (meth)acrylic acid, phenoxyphenyl acrylic acid, 3-phenoxy-2-hydroxylpropyl (meth)acrylate, 2-1-naphthoxyethyl (meth)acrylic acid, 2-2-naphthoxyethyl (meth)acrylic acid, 2-1-naphthylthioethyl (meth)acrylic acid, 2-2-naphthothioethyl (meth)acrylic acid, trimethylolpropyl triacrylate, 1,12-dodecanediol dimethacrylate, 1,6-hexanediol diacrylate, and 1,10-decanediol diacrylate.

10. The composition according to claim 3, wherein the component C is a photopolymerization initiator and/or a free radical polymerization initiator; the photopolymerization initiator is one or more selected from the group consisting of an acetophenone compound, a benzophenone compound, a thioxanthone compound, a benzoin compound, a triazine compound, a carbazole compound, a diketone compound, a sulfonium borate compound, a diazonium salt compound, an imidazole compound, and a non-imidazole compound; and the free radical polymerization initiator is one or more selected from the group consisting of a peroxide compound and a bisazo compound.

11. The encapsulation thin film according to claim 6, wherein the organic layer is the composition according to claim 3.

12. The encapsulation thin film according to claim 11, wherein the encapsulation thin film is a thin film layer with a hygroscopic degree of $9*10^{-2}$ g/m$^2$·day or less.

13. The encapsulation thin film according to claim 11, wherein the inorganic layer of the encapsulation thin film is arranged on one or two surfaces of the organic layer.

* * * * *